United States Patent
Chen et al.

(10) Patent No.: US 9,455,363 B2
(45) Date of Patent: Sep. 27, 2016

(54) PN STRUCTURE FORMED BY IMPROVED DOPING METHODS TO SIMPLIFY MANUFACTURING PROCESS OF DIODES FOR SOLAR CELLS

(71) Applicants: Jiong Chen, San Jose, CA (US); Junhua Hong, San Jose, CA (US)

(72) Inventors: Jiong Chen, San Jose, CA (US); Junhua Hong, San Jose, CA (US)

(73) Assignee: Kingstone Semiconductor Company, Limited (CN)

( * ) Notice: Subject to any disclaimer, the term of this patent is extended or adjusted under 35 U.S.C. 154(b) by 511 days.

(21) Appl. No.: 13/920,077

(22) Filed: Jun. 17, 2013

(65) Prior Publication Data

US 2014/0366936 A1 Dec. 18, 2014

(51) Int. Cl.
*H01L 31/068* (2012.01)
*H01L 31/18* (2006.01)
*H01L 21/265* (2006.01)
*H01L 21/266* (2006.01)

(52) U.S. Cl.
CPC ....... *H01L 31/0682* (2013.01); *H01L 31/1804* (2013.01); *H01L 21/266* (2013.01); *H01L 21/26586* (2013.01); *Y02E 10/547* (2013.01); *Y02P 70/521* (2015.11)

(58) Field of Classification Search
CPC .......... H01L 31/0682; H01L 31/1804; Y02P 70/521; Y02E 10/547
See application file for complete search history.

(56) References Cited

U.S. PATENT DOCUMENTS 7,883,343 B1 * 2/2011 Mulligan .......... H01L 31/02244
136/256

* cited by examiner

*Primary Examiner* — Shannon Gardner
(74) *Attorney, Agent, or Firm* — Bo-In Lin

(57) ABSTRACT

A method for doping a semiconductor substrate is disclosed wherein a layer of a first conductivity type is first formed followed by forming a blocking layer with an open area. An etch process is performed through the open area to remove the layer of the first conductivity type to exposed the top surface of the semiconductor substrate. Dopant ions are introduced to form a dopant region of a second conductivity type on the beneath the top surface of the semiconductor substrate wherein the dopant region of the second conductivity type is not in contact with the dopant layer of the first conductivity type that is not etched off thus forming a PN structure to form diodes for the interdigitated back contact photovoltaic cells. Since the ion doping processes are self-aligned, the mask requirements are minimized and the production cost for solar cells are reduced.

10 Claims, 40 Drawing Sheets

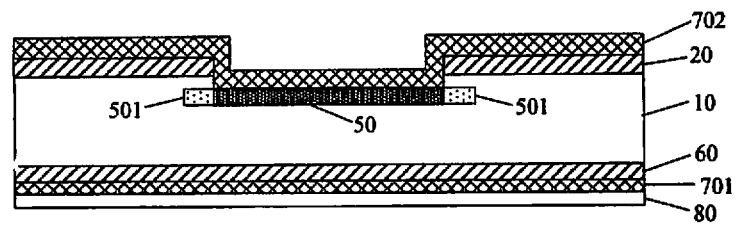
Fig. 15d
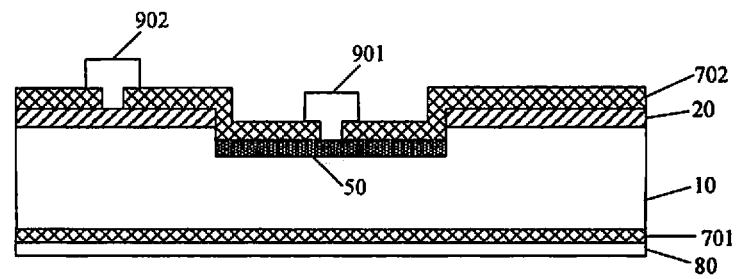
Fig. 16a
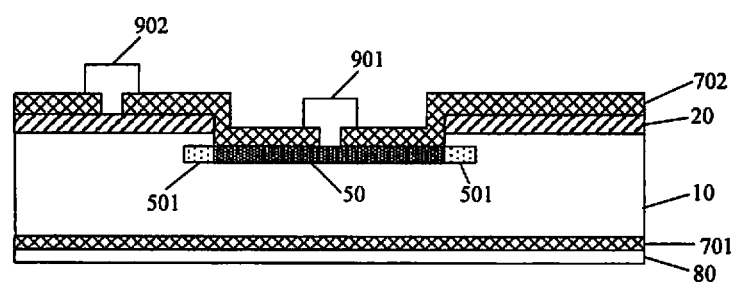
Fig. 16b
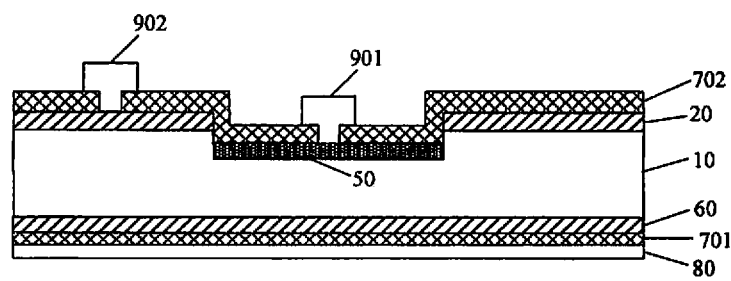

Fig. 16c
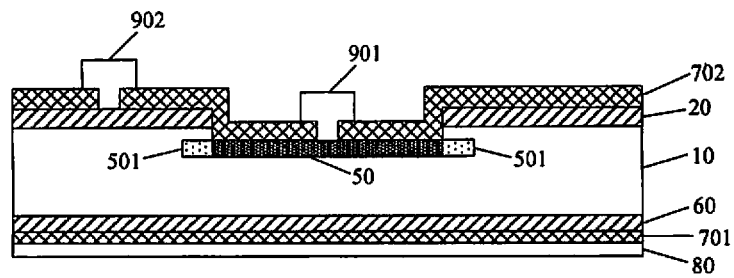
Fig. 16d
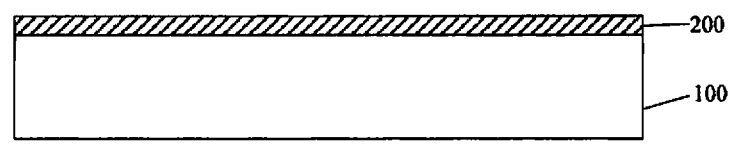
Fig. 20
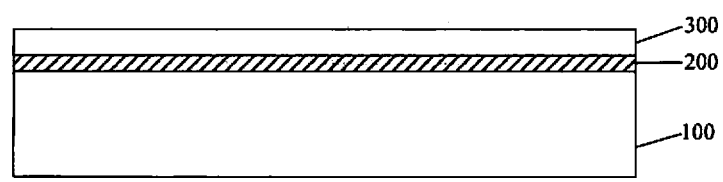
Fig. 21
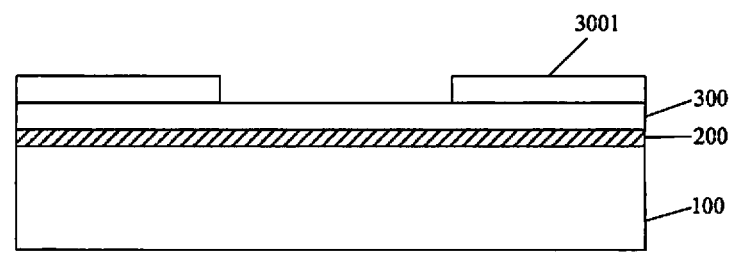
Fig. 22

PN STRUCTURE FORMED BY IMPROVED DOPING METHODS TO SIMPLIFY MANUFACTURING PROCESS OF DIODES FOR SOLAR CELLS

This application is a US Non-provisional application of a PCT Application PCT/CN2011/080101 originally filed in China with a Priority Date of Dec. 17, 2010 based on prior Chinese Patent Applications. This application claims the Priority Date of Dec. 17, 2011 based on the original PCT Application PCT/CN2011/080101 and further incorporates by reference the disclosures made in Application PCT/CN2011/08010.

BACKGROUND OF THE INVENTION

1. Field of the Invention

The invention relates generally to a doping method, configurations of PN junction and manufacturing method and apparatuses of photovoltaic cells for providing solar energy. More particularly, this invention relates to configuration and improved methods for doping PN junctions of back contacted battery cells to simplify the manufacturing methods of photovoltaic cells to capture and provide solar energy.

2. Description of the Prior Art

One of key factors for driving the technological developments in the twenty-first century is the development of renewable energy. A major aspect of the developments is to continue explore and improve the efficiency and economic competiveness among different energy sources of solar energy. Since the technology for capturing and utilizing solar energy is a clean, reliable, low maintenance, noise free, and long term sustainable energy source, governmental policies have also focused on the development of new technologies of solar energy as one of the most important development goals.

With the acceleration of the increased capacity of the photovoltaic energy generation in the past few years, large quantity of solar panels are manufactured and shipped. With the greater demand not al to be fully satisfied by the limited supply, another subject of interest is to improve the energy conversion efficiency and solar cell productivity such that the solar panel shortage issues can be properly resolved. Specifically, the solar energy is generated by exposing the solar cells to light emitting from the sun. The photons in the sun beams are projected and captured by the solar cells wherein the photons have higher energy than the energy-gap between levels of electrons circulating the nuclides thus knocking the electrons off their tracks thus generating free pairs of electrons and holes. With electron and hole pairs generated at higher energy and unstable states, these unstable pairs soon encountered and collide with other nuclides and energy the energy absorbed from photons are converted into heat and electric current or transmitting through the PN junctions of the solar cells as direct current while the heat generated in the processes is energy lost in the energy conversion processes. There is additional electrical conduction and DC-to-AC conversion losses before the solar energy is finally utilized as industrial or household electric energies. Therefore, the efficiency of energy utilizations for solar power is determined by multiple factors including but not limited to the materials of the solar cells, the manufacturing methods and the configurations of the solar cells, and the angles, areas, intensity and the light paths of the sun beams projected onto the solar panels. Instead of placing the solar cells on the front surface that often-block the full absorption of the photons; a recent improvement is to form the solar cells at the back surface of the substrate to reduce the front-surface block off losses. The configuration is often referred to as back contact cell. The doping regions and electrical contacts to the cells are therefore formed near and on the back surface of the substrate. The electrical conduction losses within the substrate especially through the lateral directions are reduced while light collection through the entire front surface can also be conveniently achieved thus greatly increase the efficiency of the solar cells. There are further advantages in cost reduction for producing the solar panels because it is more convenient to package the solar cells formed with back contact configurations.

However, as the solar cells are formed near the back surface of the substrate, the free electron and hole pairs are required to travel through almost the entire thickness to the reach the back surface. For this reason, the silicon substrate must be able to maintain long life for the charged particles travel through the substrate in order to avoid combination of these charge particles before reaching the back surface thus greatly reduces the efficiency of the solar cells due to lower current density. An improved configuration generally referred to as interdigitated back contact (IBC) battery cells is implemented to overcome such technical limitations. In various publications related to manufacturing processes to produce the IBC solar cells, specifically in the manufacturing processes implemented by SUNPOWER, complicated lithographic processes are applied. These processes cause high production costs due to the requirements of multiple masks. For the purpose of reducing the production costs, some manufacturers use the processes of applying masks to form intermixed alternate P-N dopant regions. However, the manufacturing costs are still very high due to the technical issues of applying multiple masks and the precision restrictions for alignment required by lithography. Therefore, there is an urgent need in the art of manufacturing and designing solar cells to provide new and improved manufacturing process with new configurations of the MC solar cell to overcome the above-discussed technical limitations and difficulties.

SUMMARY OF THE PRESENT INVENTION

It is therefore an aspect of the present invention to provide new and improved manufacturing process to form PN structures to function as interdigitized diodes for IBC solar cells such that the above discussed difficulties and limitations can be resolved. Specifically, the present invention simplifies the manufacturing processes by forming a self-aligned doping configuration for applying a directional implantation process such that the mask requirements are minimized.

Specifically, it is an aspect of this invention that the doping process takes advantage of the special configuration that openings are etched through blocking or photoresist layers to provide a self-aligned path for doping the directly exposed region of a substrate underneath the open area such that PN structures can be formed without requiring masks.

It is another aspect of this invention that designated open areas are etched to open the self-aligned doping through holes for introducing dopant into designated areas in the substrate thus forming the PN structure not requiring extra masks. The designated open areas may be defined by simplified screen printing process so that more lithographic processes using expensive equipment are not required.

These and other objects and advantages of the present invention will no doubt become obvious to those of ordinary skill in the art after having read the following detailed description of the preferred embodiment, which is illustrated in the various drawing figures.

BRIEF DESCRIPTION OF THE DRAWINGS

FIGS. 15a to 15d are a set of cross sectional views for showing the processes of forming the passivation layers in the front and back sides of the substrate as the processing steps implemented in different embodiment described below.

FIGS. 16a to 16d are a set of cross sectional views for showing the processes of opening contact opening in the passivation layer and forming electrodes as the processing steps implemented in different embodiment described below.

FIGS. 20, 21, 22, 23, 24a and 24b are a series of cross sectional views for illustrating the processing steps for manufacturing the PN junctions in different embodiments of this invention.

DETAILED DESCRIPTION OF THE EMBODIMENT

Figure 1:
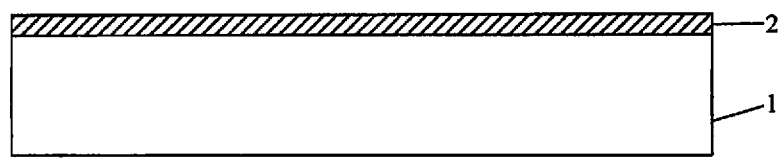
FIGS. 1, 2, 3, 4a to 4b, 5a to 5d are a series of cross sectional views for illustrating the processing steps for manufacturing the PN junctions as that further described in different embodiments of this invention

The drawings in combination with the following descriptions present different embodiments of the present invention. Specifically, the folowing different embodiments are described according to the drawing as set forth below.

FIGS. 1, 2, 3, 4a, 5a and 7a are the step by step schematic diagrams of doping methods for PN junction formation of embodiments 1 to 4.

FIGS. 1, 2, 3, 4a, 5a, 7a and 7e are the step by step schematic diagrams of a doping method for PN junction formation of embodiment 5.

FIGS. 1, 2, 3, 4a, 5a, 7a, 8a and 9a are the step by step schematic diagrams of the solar cell manufacturing methods of embodiments 6 to 7.

FIGS. 1, 2, 3, 4a, 5a, 7a, 7e, 8e and 9a are the step by step schematic diagrams of a solar cell manufacturing method of embodiment 8.

FIGS. 1, 2, 3, 4b, 5b and 7b are the step by step schematic diagrams of a doping method for PN junction formation of embodiment 9.

FIGS. 1, 2, 3, 4b, 5b, 7b and 7f are the step by step schematic diagrams of a doping method for PN junction formation of embodiment 10.

FIGS. 1, 2, 3, 4b, 5b, 7b; 8b and 9b are the step by step schematic diagrams of a solar cell manufacturing method of embodiment 11.

FIGS. 1, 2, 3, 4b, 5b, 7h, 7f, 8f and are the step by step schematic diagrams of a solar cell manufacturing method of embodiment 12.

FIGS. 1, 2, 3, 4a, 5c and 7c are the step by step schematic diagrams of a doping method for PN junction formation of embodiments 13.

Figure 5A:
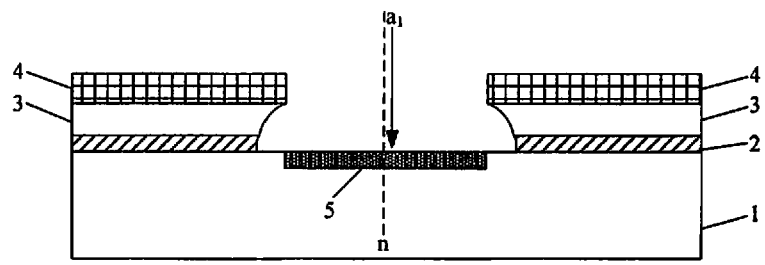
Figure 5B:
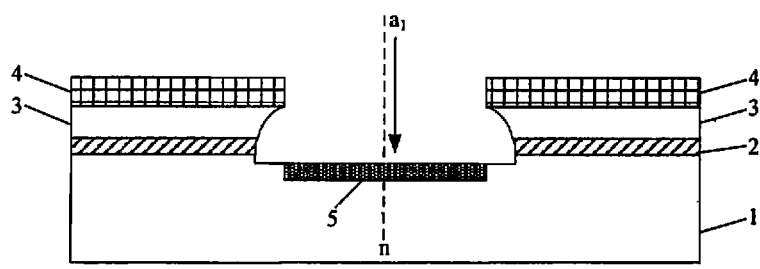
Figure 5C:
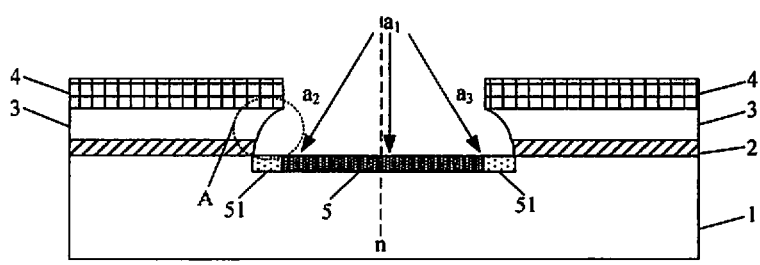
Figure 6C:
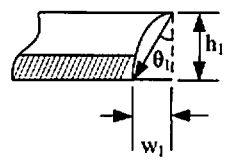
FIGS. 6c and 6d are explosive views to further illustrate the configurations shown in FIGS. 5c and 5d.

FIG. 6c is the partially enlarged drawing of the dashed area A in FIG. 5c.

FIGS. 1, 2, 3, 4a, 5c, 7c and 7g are the step by step schematic diagrams of a doping method for PN junction formation of embodiment 14.

FIGS. 1, 2, 3, 4a, 5c, 7c, 8c and 9c are the step by step schematic diagrams of a solar cell manufacturing method of embodiment 15.

FIGS. 1, 2, 3, 4a, 5c, 7c, 7g, 8g and 9g are the step by step schematic diagrams of a solar cell manufacturing method of embodiment 16.

FIGS. 1, 2, 3, 4b, 5d and 7d are the step by step schematic diagrams of a doping method for PN junction formation of embodiment 17.

Figure 5D:
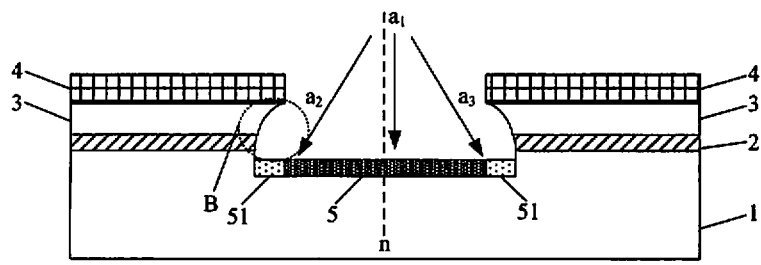
Figure 6D:
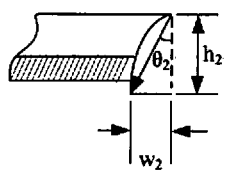

FIG. 6d is the partially enlarged drawing of the dashed area B in FIG. 5d.

FIGS. 1, 2, 3, 4b, 5d, 7d and 7h are the step by step schematic diagrams of a doping method for PN junction formation of embodiment 18.

FIGS. 1, 2, 3, 4b, 5d, 7d, 8d and 9d are the step by step schematic diagrams of a solar cell manufacturing method of embodiment 19.

FIGS. 1, 2, 3, 4b, 5d, 7d, 7h, 8h and 9h are the step by step schematic diagrams of a solar cell manufacturing method of embodiment 20.

FIGS. 10, 11, 12, 13, 14b and 16c are the step by step schematic diagrams of doping methods for PN junction formation of embodiments 21 to 30.

FIGS. 10, 11, 12, 13, 14b and 14d are the step by step schematic diagrams of a doping method for PN junction formation of embodiment 31.

FIGS. 10, 11, 12, 13, 14b, 15b and 16b are the step by step schematic diagrams of a solar cell manufacturing method of embodiment 32.

FIGS. 10, 11, 12, 13, 14b, 14d, 15b and 16d are the step by step schematic diagrams of a solar cell Manufacturing method of embodiment 33.

FIGS. 20, 21, 22, 23, 24a and 25a are the step by step schematic diagrams of doping methods for PN junction formation of embodiments 34 to 36.

FIGS. 20, 21, 22, 23, 24a, 25a and 25c are the step by step schematic diagrams of a doping method for PN junction formation of embodiment 37.

FIGS. 20, 21, 22, 23, 24a, 25a, 26a and 27a are the step by step schematic diagrams of a solar cell manufacturing method of embodiment 38.

FIGS. 20, 21, 22, 23, 24a, 25a, 25c, 26c and 27c are the step by step schematic diagrams of a solar cell manufacturing method of embodiment 39.

FIGS. 20, 21, 22, 23, 24b and 25b are the step by step schematic diagrams of a doping method for PN junction formation of embodiment 40.

FIGS. 20, 21, 22, 23, 24b, 25b and 25d are the step by step schematic diagrams of a doping method for PN junction formation of embodiment 41.

FIGS. 20, 21, 22, 23, 24b, 25b, 26b and 27b are the step by step schematic diagrams of a solar cell manufacturing method of embodiment 42.

FIGS. 20, 21, 22, 23, 24b, 25b, 25d, 26d and 27d are the step by step schematic diagrams of a solar cell manufacturing method of embodiment 43.

FIGS. 30, 31, 32a, 33a and 35a are the step by step schematic diagrams of a doping method for PN junction formation of embodiment 44.

FIGS. 30, 31, 32a, 33a, 35a and 35e are the step by step schematic diagrams of a doping methods for PN junction formation of embodiment 45.

FIGS. 30, 31, 32a, 33a, 35a and 35i are the step by step schematic diagrams of a doping method for PN junction formation of embodiment 46.

FIGS. 30, 31, 32a, 33a, 35a and 35m are the step by step schematic diagrams of a doping method for PN junction formation of embodiment 47.

FIGS. 30, 31, 32a, 33a, 35i, 35i and 35q are the step by step schematic diagrams of a doping method for PN junction formation of embodiment 48.

FIGS. 30, 31, 32a, 33a, 35i, 35m and 35u are the step by step schematic diagrams of a doping method for PN junction formation of embodiment 49.

FIGS. 30, 31, 32a, 33a, 35a, 36a and 27a are the step by step schematic diagrams of a solar cell manufacturing method of embodiment 50.

FIGS. 30, 31, 32a, 33a, 35a, 35e, 36e and 27e are the step by step schematic diagrams of a solar cell manufacturing method of embodiment 51.

FIGS. 30, 31, 32a, 33a, 35a, 35i, 36i and 27i are the step by step schematic diagrams of a solar cell manufacturing method of embodiment 52.

FIGS. 30, 31, 32a, 33a, 35a, 35m, 36m and 27m are the step by step schematic diagrams of a solar cell manufacturing method of embodiment 53.

FIGS. 30, 31, 32a, 33a, 35a, 35i, 35q, 36q and 27q are the step by step schematic diagrams of a solar cell manufacturing method of embodiment 54.

FIGS. 30, 31, 32a, 33a, 35a, 35m, 35u, 36u and 27u are the step by step schematic diagrams of a solar cell manufacturing method of embodiment 55.

FIGS. 30, 31, 32b, 33b and 35b are the step by step schematic diagrams of a doping method for PN junction formation of embodiment 56.

FIGS. 30, 31, 32b, 33b, 35b and 35f are the step by step schematic diagrams of a doping method for PN junction formation of embodiment 57.

FIGS. 30, 31, 32b, 33b, 35b and 35j are the step by step schematic diagrams of a doping method for PN junction formation of embodiment 58.

FIGS. 30, 31, 32b, 33b, 35b and 35n are the step by step schematic diagrams of a doping method for PN junction formation of embodiment 59.

FIGS. 30, 31, 32b, 33b, 35b, 35j and 35r are the step by step schematic diagrams of a doping method for PN junction formation of embodiment 60.

FIGS. 30, 31, 32b, 33b, 35b, 35n and 35v are the step by step schematic diagrams of a doping method for PN junction formation of embodiment 61.

FIGS. 30, 31, 32b, 33b, 35b, 36b and 37b are the step by step schematic diagrams of a solar cell manufacturing method of embodiment 62.

FIGS. 30, 31, 32b, 33b, 35b, 35f, 36f and 37f are the step by step schematic diagrams of a solar cell manufacturing method of embodiment 63.

FIGS. 30, 31, 32b, 33b, 35b, 35j, 36j and 37j are the step by step schematic diagrams of a solar cell manufacturing method of embodiment 64.

FIGS. 30, 31, 32b, 33b, 35b, 35n, 36n and 37n are the step by step schematic diagrams of a solar cell manufacturing method of embodiment 65.

FIGS. 30, 31, 32b, 33b, 35b, 35j, 35r, 36r and 37r are the step, by step schematic diagrams of a solar cell manufacturing method of embodiment 66.

FIGS. 30, 31, 32b, 33b, 35b, 35n, 35v, 36v and 37v are the step by step schematic diagrams of a solar cell manufacturing method of embodiment 67.

FIGS. 30, 31, 32a, 33c and 35c are the step by step schematic diagrams of a doping methods for PN junction formation of embodiment 68.

Figure 33A:
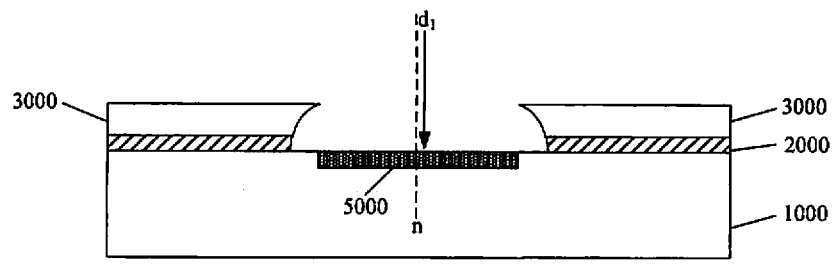
Figure 33B:
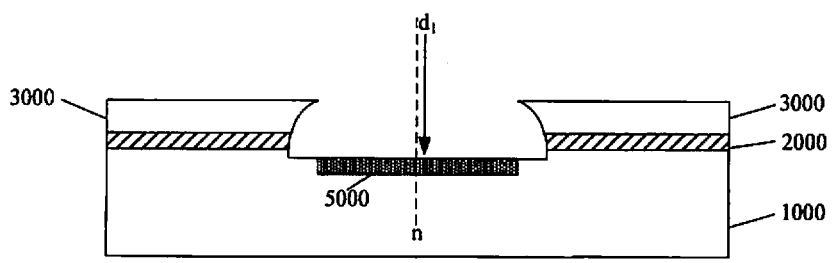
Figure 33C:
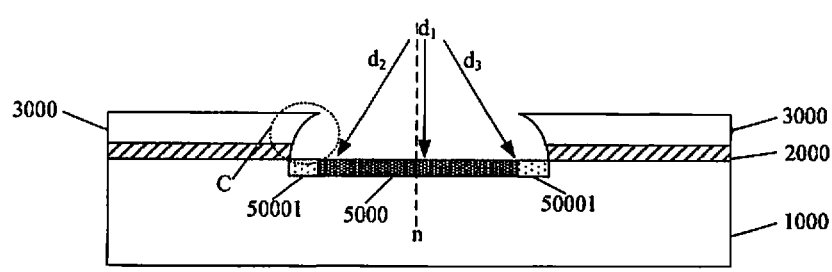
Figure 34C:
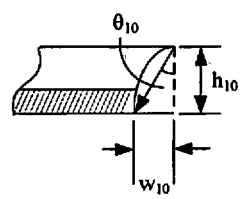
FIGS. 34c and 34d are explosive views to further illustrate the configurations shown in FIGS. 33c and 33d.

FIG. 34c is partially enlarged drawing of the dashed area C in FIG. 33c.

FIGS. 30, 31, 32a, 33c, 35c and 35g are the step by step schematic diagrams of a doping method for PN junction formation of embodiment 69.

FIGS. 30, 31, 32a, 33c, 35c and 35k are the step by step schematic diagrams of a doping method for PN junction formation of embodiment 70.

FIGS. 30, 31, 32a, 33c, 35c and 35o are the step by step schematic diagrams of a doping method for PN junction formation of embodiment 71.

FIGS. 30, 31, 32a, 33c, 35c, 35k and 35s are the step by step schematic diagrams of a doping method for PN junction formation of embodiment 72.

FIGS. 30, 31, 32a, 33c, 35c, 35o and 35w are the step by step schematic diagrams of a doping method for PN junction formation of embodiment 73.

FIGS. 30, 31, 32a, 33c, 35c, 36c and 37c are the step by step schematic diagrams of a solar cell manufacturing method of embodiment 74.

FIGS. 30, 31, 32a, 33c, 35c, 35g, 36g and 37g are the step by step schematic diagrams of a solar cell manufacturing method of embodiment 75.

FIGS. 30, 31, 32a, 33c, 35c, 35k, 36k and 37k are the step by step schematic diagrams of a solar cell manufacturing method of embodiment 76.

FIGS. 30, 31, 32a, 33c, 35c, 35o, 36o and 37o are the step by step schematic diagrams of a solar cell manufacturing method of embodiment 77.

FIGS. 30, 31, 32a, 33c, 35c, 35k, 35s, 36s and 37s are the step by step schematic diagrams of a solar cell manufacturing method of embodiment 78.

FIGS. 30, 31, 32a, 33c, 35c, 35o, 35w, 36w and 37w are the step by step schematic diagrams of a solar cell manufacturing method of embodiment 79.

FIGS. 30, 31, 32b, 33d and 35d are the step by step schematic diagrams of a doping method for PN junction formation of embodiment 80.

Figure 33D:
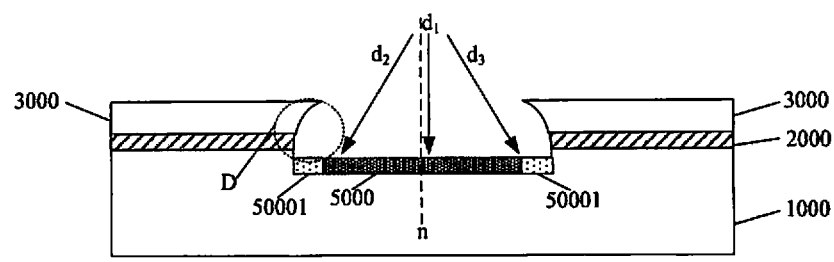
Figure 34D:
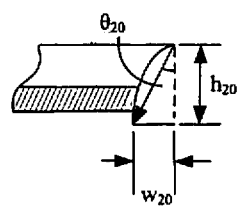

FIG. 34d is the partially enlarged drawing of the dashed area D in FIG. 33d.

FIGS. 30, 31, 32b, 33d, 35d and 35h are the step by step schematic diagrams of a doping method for PN junction formation of embodiment 81.

FIGS. 30, 31, 32b, 33d, 35d and 35l are the step by step schematic diagrams of a doping method for PN junction formation of embodiment 82.

FIGS. 30, 31, 32b, 33d, 35d and 35p are the step by step schematic diagrams of a doping method for PN junction formation of embodiment 83.

FIGS. 30, 31, 32b, 33d, 35d, 35l and 35t are the step by step schematic diagrams of a doping method for PN junction formation of embodiment 84.

FIGS. 30, 31, 32b, 33d, 35d, 35p and 35x are the step by step schematic diagrams of a doping method for PN junction formation of embodiment 85.

FIGS. 30, 31, 32b, 33d, 35d, 36d and 37d are the step by step schematic diagrams of a solar cell manufacturing method of embodiment 86.

FIGS. 30, 31, 32b, 33d, 35d, 35h, 36h and 37h are the step by step schematic diagrams of a solar cell manufacturing method of embodiment 87.

FIGS. 30, 31, 32b, 33d, 35d, 35l, 36l and 37l are the step by step schematic diagrams of a solar cell manufacturing method of embodiment 88.

FIGS. 30, 31, 32b, 33d, 35d, 35p, 36p and 37p are the step by step schematic diagrams of a solar cell manufacturing method of embodiment 89.

FIGS. 30, 31, 32b, 33d, 35d, 35l, 35t, 36t and 37t are the step by step schematic diagrams of a solar cell manufacturing method of embodiment 90.

FIGS. 30, 31, 32b, 33d, 35d, 35p, 35x, 36x and 37x are the step by step schematic diagrams of a solar cell manufacturing method of embodiment 91.

First Embodiment

Referring to FIG. 1 that illustrates step S1 wherein an N+ layer 2 is formed in a bottom surface of a N type substrate.

The sheet resistance of the N+ layer 2 is about 200 Ohm/sq. Specifically, the N+ layer 2 can be formed by implanting phosphorous ions of 500 eV or greater into the N type substrate 1.

Figure 2:
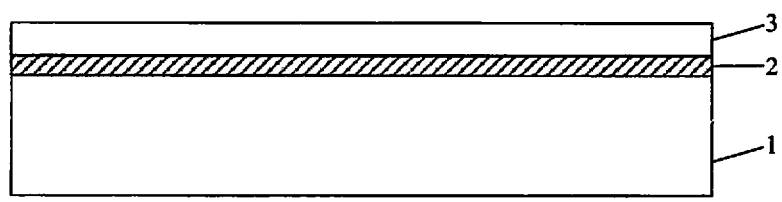

Referring to FIG. 2 for processing step S2 wherein a blocking layer 3 is formed on top of the N+ layer 2. The blocking layer 3 may be formed by applying a chemical vapor deposition having a thickness greater than 3 micrometers. In one of the embodiments, the blocking layer 3 is a silicon dioxide layer having a thickness of 1.5 micrometers.

Figure 3:
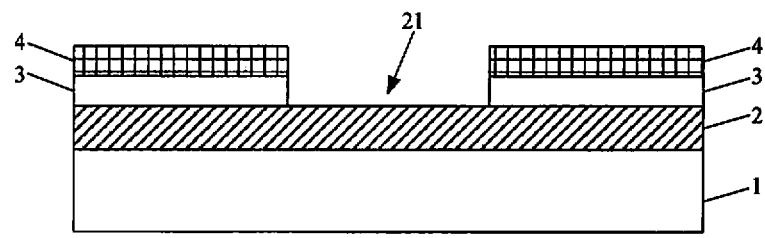
Figure 4A:
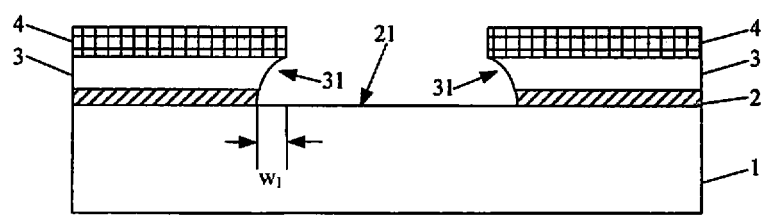

Referring to FIG. 3 and FIG. 4A, a mask 4 is formed on top of the blocking layer leaving an open area 21 not covered by the mask 4. The mask may be formed by applying a screen printing process and the mask is composed of a photoresist material.

Referring to FIG. 4a for step S4 wherein an etching process is applied to etch off the blocking layer 3 and the N+ layer 2 in the open area 21. The etching process is an anisotropic etching process that etches off a laterally extended portion 31 having a lateral width "w" into the blocking layer 3 and the N+ layer 2. A wet etch process may be applied to etch to a vertical depth as the total layer thickness of the blocking layer 3 and N+ layer 2 and etching anisotropically into a lateral portion with width "w" as shown in FIG. 4a wherein w is about 2 micrometers.

Referring to FIG. 5a for processing step S3 wherein accelerated boron ions at an energy of 500 eV or greater is implanted along a direction alto form a P+ dopant region 5. The directional is perpendicular to the bottom surface of the open area 21 wherein the sheet resistance of the P+ region 5 is approximately 40 ohms/sq. Because the ions are implant perpendicularly to the opening of area 21 through the opening of the mask 4 and the blocking layer 3, the P+ region 5 has a width is the narrowest width of the open area 21 and therefore, the P+ region 5 is not in contact with the N+ region 2. In a specific embodiment, the width of the P+ region 5 is about 100 micrometers and the distance between the P+ region 5 and the N+ layer 2 is about 2 micrometers. The bottom surface of the opening area 21 opened by the wet etch process is about 104 micrometers. The manufacturing processes proceed with a reflow process generally under 700 degrees Celsius and in specific embodiment, a reflow process is performed at 750 degrees Celsius for 30 minutes to activate the dopant ions.

Figure 7A:
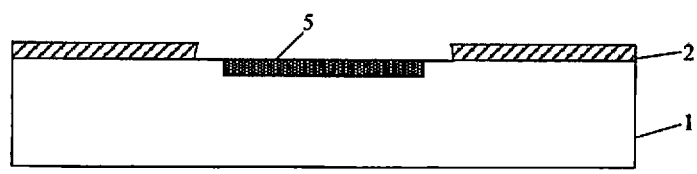
FIGS. 7a to 7h are a set of cross sectional views for showing the processes of removing the mask and forming the PN junctions in the substrate with different configurations as the processing steps implemented in different embodiment described below.

Referring to FIG. 7a for step S6, wherein regular methods are applied to remove the mask 4 and the blocking layer 3. A PN structure comprising P+/N/N+ regions is formed. The processes then proceed with a passivation process and an electroplating process to form electrodes to complete the manufacture of the IBC battery cells. An exemplary embodiment is to form silicon nitride as a passivation layer and simultaneously function as an antireflective layer. The processes followed by forming electrodes in contact with the P+ region 5 and the N+ region 2 then complete the processes with an anneal operation to fuse the metal element of the electrode with the N type substrate 2 into co-crystallized structure thus completing the manufacture of the interdigitized back contact (IBC) solar cells.

Second Embodiment

The functional and structural principles and the manufacturing processes of this embodiment are the same as the first embodiment. The differences of this embodiment are related to the selection of different materials and the parameters of the manufacturing processes.

In step S1, an N+ layer 2 is formed in a bottom surface of the N type substrate 1. The sheet resistance of the N+ layer 2 is about 100 Ohm/cm2. Specifically, the N+ layer 2 is formed by implanting phosphorous ions of 50 KeV into the bottom surface of the N type substrate 1. In step S3, the mask layer 4 is composed of alloy of copper and aluminum. In step S4, the wet etch process anisotropically etches a lateral width W1 that is approximately 5 micrometers.

In step S5, the boron ions are accelerated to 50 KeV to perform a perpendicular implant along the a1 direction to form the P+ region 5 that has a sheet resistance of 120 Ohms/sq. The width of the P+ region 5 is approximately 150 micrometers and the distance between the P+ region 5 and the N+ region 2 is about 5 micrometers. Therefore, the total width at the bottom of the opening formed by the anisotropic etch process is about 160 micrometers. A reflow process at a temperature of 1100 degrees Celsius is carried out for 30 seconds to activate the dopant ions. Other processing steps are the same as the first embodiment.

A PN structure is formed with the P+/N/N+ dopant regions. The processes then proceed with a passivation process and an electroplating process to form electrodes to complete the manufacture of the IBC battery cells. An exemplary embodiment is to form silicon nitride as a passivation layer and simultaneously function as an antireflective layer. The processes followed by forming contact openings through the passivation layer in the area above the P+ region 5 and the N+ region 2 to form electrodes in contact with the P+ region 5 and the N+ region 2 then complete the processes with an anneal operation to fuse the metal element of the electrode with the N type substrate 2 into co-crystallized structure thus completing the manufacture of the interdigitized back contact (IBC) solar cells.

Third Embodiment

The functional and structural principles and the manufacturing processes of this embodiment are the same as the first embodiment. The differences of this embodiment are the selection of different materials and the application of different processing parameters in the manufacturing processes.

In step S1, an N+ layer 2 is formed in a bottom surface of the N type substrate 1. The sheet resistance of the N+ layer 2 is about 40 Ohm/sq. Specifically, the N+ layer 2 is formed by implanting phosphorous ions of 30 KeV into the bottom surface of the N type substrate 1. In step S3, the mask layer 4 is composed of alloy of copper and aluminum. In step S4, the wet etch process anisotropically etches a lateral width W1 that is approximately 30 micrometers.

In step S5, the boron ions are accelerated to 30 KeV to perform a perpendicular implant along the a1 direction to form the P+ region 5 that has a sheet resistance of 100 Ohms/sq. The width of the P+ region 5 is approximately 150 micrometers and the distance between the P+ region 5 and the N+ region 2 is about 5 micrometers. Therefore, the total width at the bottom of the opening formed by the anisotropic etch process is about 210 micrometers. A reflow process at a temperature of 850 degrees Celsius is carried out for 30 seconds to activate the dopant ions. Other processing steps are the same as the first embodiment.

A PN structure is formed with the P+/N/N+ dopant regions. The processes then proceed with a passivation process and an electroplating process to form electrodes to complete the manufacture of the IBC battery cells. An exemplary embodiment is to form silicon nitride as a passivation layer and simultaneously function as an antireflective layer. The processes followed by forming contact openings through the passivation layer in the area above the P+ region 5 and the N+ region 2 to form electrodes in contact with the P+ region 5 and the N+ region 2 then complete the processes with an anneal operation to fuse the metal element of the electrode with the N type substrate 2 into co-crystallized structure thus completing the manufacture of the interdigitized back contact (IBC) solar cells.

Fourth Embodiment

The functional and structural principles and the manufacturing processes of this embodiment are the same as the first embodiment. The differences of this embodiment are in step S2 wherein the N+ dopant layer is formed with a diffusion process to have area sheet resistance of 200 ohms/sq. All other processing steps are the same as the first embodiment.

Fifth Embodiment

The functional and structural principles and the manufacturing processes of this embodiment are the same as the first embodiment. The differences of this embodiment are further processes are carried out after the PN structure as shown in FIG. 7a is completed.

Figure 7B:
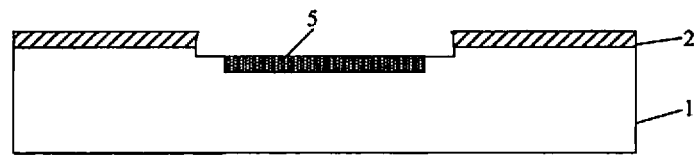
Figure 7C:
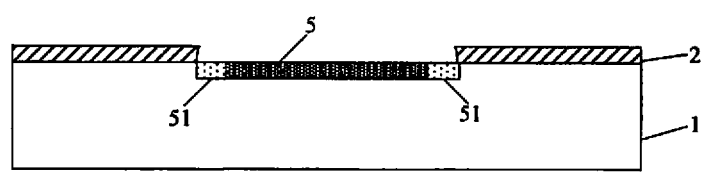
Figure 7D:
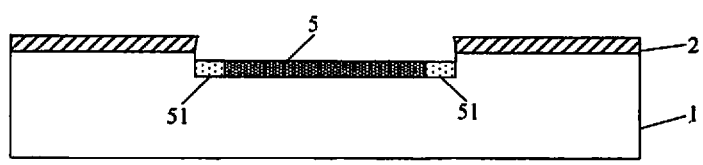
Figure 7E:
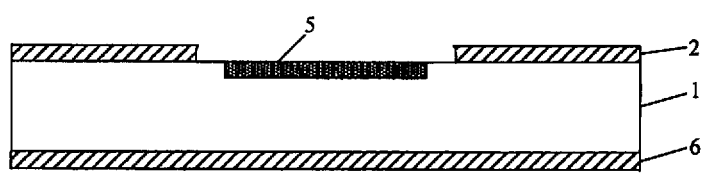
Figure 7F:
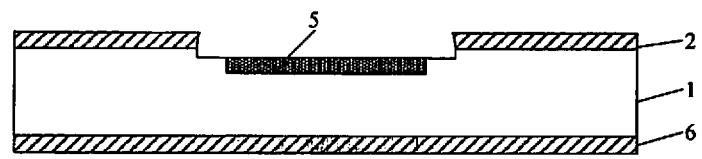

Referring to FIG. 7e, an N+ layer 6 is formed at the backside of the substrate 1 by implanting phosphorous ions to form the N+ layer 6 having a sheet resistance of 200 ohms/sq. The processes of this embodiment thus forming a PN structure as that shown in FIG. 7e.

Sixth Embodiment

The manufacturing processes of this embodiment are illustrated by FIGS. 1-3, 4a, 5a, 7-9a and also based on the descriptions of First Embodiment.

Referring to FIGS. 1-3, 4a, 5a and 7a wherein a PN structure as shown in FIG. 7a is formed by applying the processing steps of the First Embodiment.

Figure 8A:
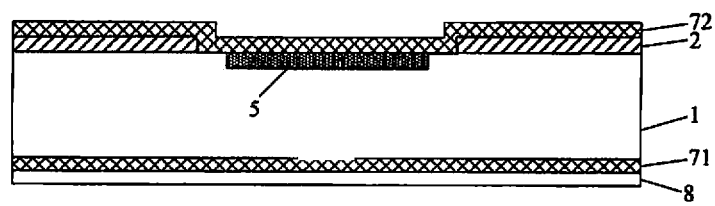
FIGS. 8a to 8h are a set of cross sectional views for showing the processes of forming the passivation layers in the front and back sides of the substrate as the processing steps implemented in different embodiment described below.
Figure 8B:
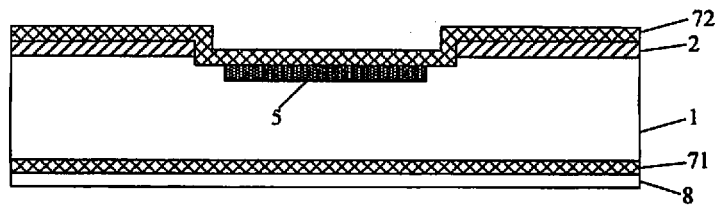
Figure 8C:
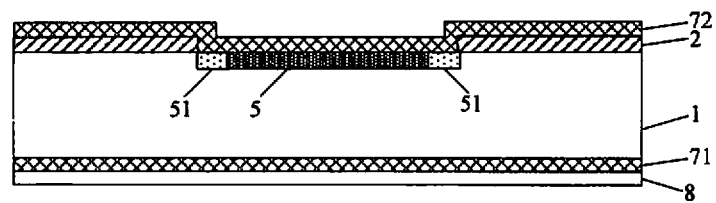
Figure 8D:
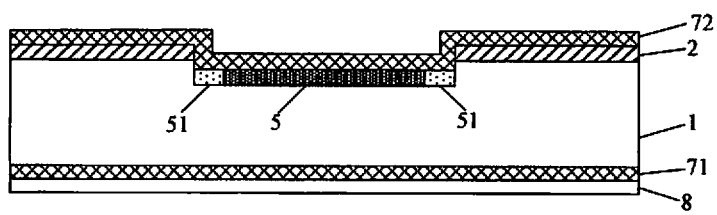

Referring to FIG. 8a, a first passivation layer 71 and a transparent film are formed on the backside of the substrate and a second passivation layer 72 is formed to cover over the P+/N/N+ regions opposite the first passivation layer 71. The passivation layers 71 and 72 are silicon oxide layers formed by a PECVD process and the transparent film is a silicon nitride late.

Figure 9A:
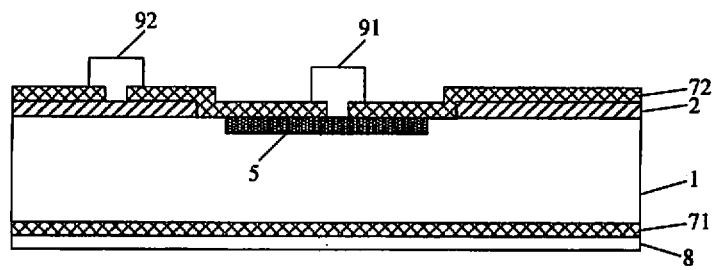
FIGS. 9a to 9h are a set of cross sectional views for showing the processes of opening contact opening in the passivation layer and forming electrodes as the processing steps implemented in different embodiment described below.
Figure 9B:
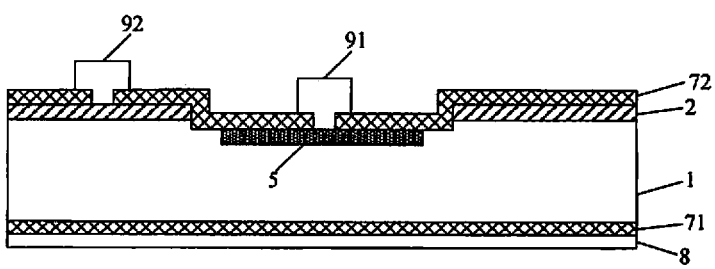
Figure 9C:
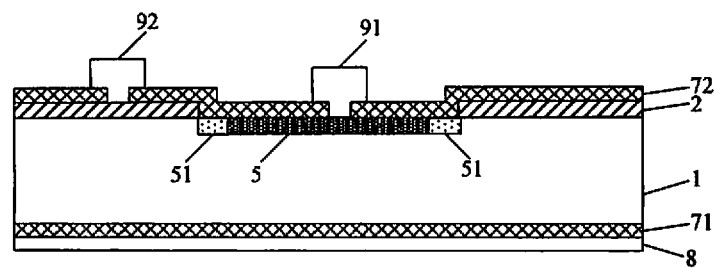
Figure 9D:
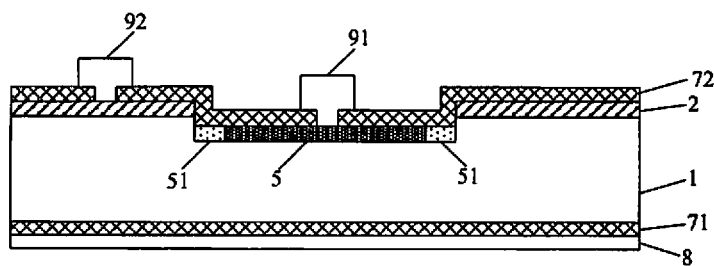

Referring to FIG. 9a, a positive electrode 91 is formed to contact the p+ region 6 and a negative electrode 92 is formed to contact the N+ region 2. Specifically, the electrodes are composed of silver formed by applying a screen printing process. An anneal process at an elevated temperature at 850 degrees Celsius for ten minutes is carried out to fuse the metal element of the electrodes into co-crystallized structure thus completing the manufacture of the interdigitized back contact (IBC) solar cells as shown in FIG. 9a.

Seventh Embodiment

The functional principles and the processing steps of the seventh embodiment is the same as the sixth embodiment. The differences are the selections of materials and the processing parameters.

The first passivation layer 71 and the transparent film 8 are formed with silicon nitride while the second passivation layer 72 is formed with amorphous silicon film.

FIG. 9a shows the processes to form the positive and negative electrodes 91 and 92 on top of the P+ region 5 and the N+ region 2 respectively. Two contact openings are formed through the second passivation layer 72. The electrodes 91 and 92 are formed with the metal plugs filling in the contact openings to contact region 2 respectively.

An anneal process at an elevated temperature at 900 degrees Celsius for ten minutes is carried out to fuse the metal element of the electrodes into co-crystallized structure with the PN structure thus completing the manufacture of the interdigitized back contact (IBC) solar cells as shown in FIG. 9a.

Eighth Embodiment

The manufacturing processes of this embodiment are illustrated by FIGS. 1, 3, 4a, 5a, 7a, 7e, 8e, and 9e and also based on the descriptions of Fifth Embodiment.

Referring to FIGS. 1-3, 4a, 5a, 7a and 7e wherein a PN structure as shown in FIG. 7e is formed by applying the processing steps of the Fifth Embodiment.

Figure 8E:
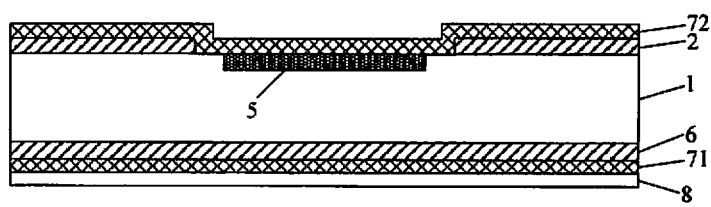
Figure 8F:
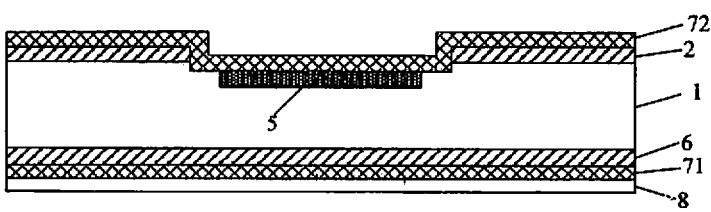
Figure 8G:
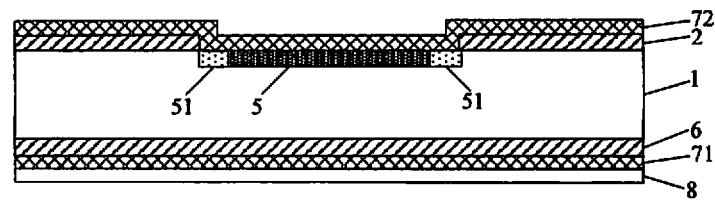
Figure 8H:
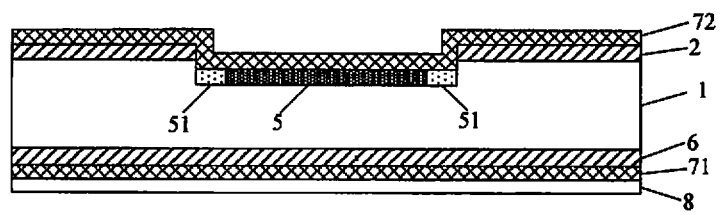

Referring to FIG. 8e, a first passivation layer 71 and a transparent film 8 are formed on the backside of the substrate and a second passivation layer 72 is formed to cover over the P+/N/N+ regions opposite the first passivation layer 71. The passivation layers 71 and 72 are silicon oxide layers formed by a PECVD process and the transparent film is a silicon nitride late.

Figure 9E:
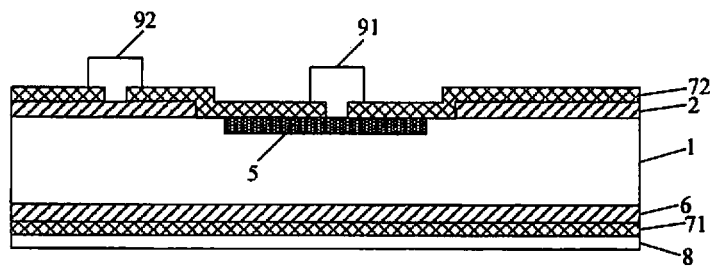
Figure 9F:
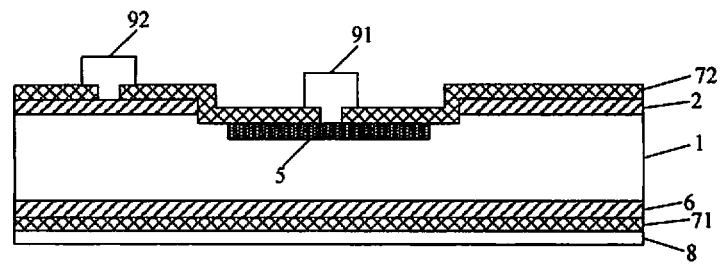
Figure 9G:
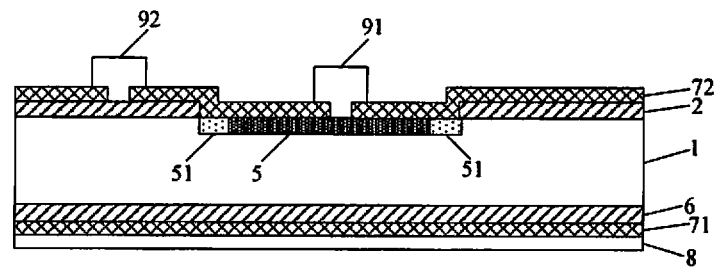
Figure 9H:
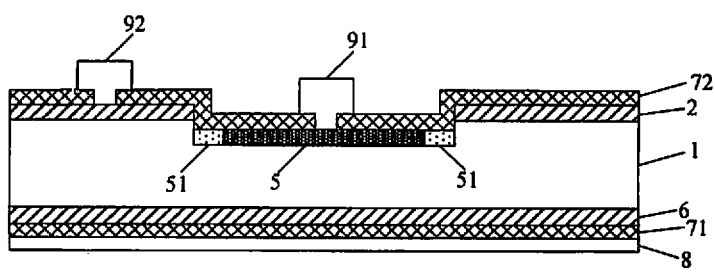

Referring to FIG. 9e, a positive electrode 91 is formed to contact the p+ region 6 and a negative electrode 92 is formed to contact the N+ region 2. Specifically, the electrodes are composed of silver formed by applying a screen printing process. An anneal process at an elevated temperature at 900 degrees Celsius for ten minutes is carried out to fuse the metal element of the electrodes into co-crystallized structure thus completing the manufacture of the interdigitized back contact (IBC) solar cells as shown in FIG. 9e.

Ninth Embodiment

The functional and structural principles and the manufacturing processes of this embodiment are described according to the illustrations of FIGS. 1-3, 4b, 5b and 7b and are similar to the First Embodiment. The differences of this embodiment are the selection of different materials and the applications of different manufacturing parameters.

Figure 4B:
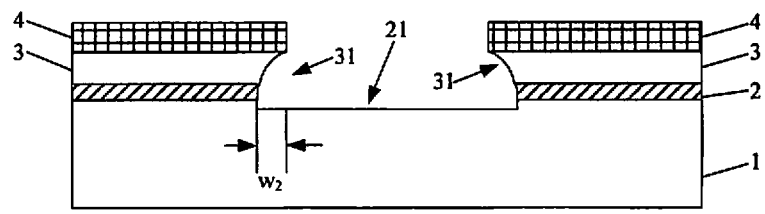

FIG. 4b shows the step S4 wherein the mask 4 is applied to carry out an etch process to remove the blocking layer 3 and the N+ dopant layer in the open area 21. The etch process is an anisotropic etch that remove a lateral portion of the blocking layer 3 and the N+ region near the bottom surface of the opening under the open area 21. The etch process further remove a top portion of the substrate 1 and a shallow trench is opened on the top surface of the N-substrate 1.

FIG. 5b shows the step S5 wherein boron ions are implanted at energy of 40 Kev along a perpendicular direction alto form a P+ dopant region 5.

FIG. 7b shows the step S6 wherein the mask 4, the blocking layer 3 are removed by applying a regular removal process thus exposing the P+ region formed in the shallow trench on the top surface of the N-type substrate 1 surrounded by N-type substrate and the N+ dopant region 2 thus constituting a PN structure comprising P+N/N+ regions. Other processing steps are the same as that described for the First Embodiment.

Tenth Embodiment

The functional and structural principles and the manufacturing processes of this embodiment are the same as the Ninth Embodiment. The differences of this embodiment are the additional processes that are carried out after the PN structure as shown in FIG. 7b is completed Referring to FIG. 7f, an N+ layer 6 is formed at the backside of the substrate 1 by implanting phosphorous ions to form the N+ layer 6 having a sheet resistance of 30 ohms/sq. The processes of this embodiment thus forming a PN structure as that shown in FIG. 7f.

Eleventh Embodiment

The manufacturing processes of this embodiment are illustrated by FIGS. 1, 3, 4b, 5b, 7b, and 9b and also based on the descriptions of the Ninth Embodiment.

Referring to FIGS. 1, 3, 4b, 5b, and 7b, wherein a PN structure as shown in FIG. 7b is formed as that is described for the Ninth Embodiment. The manufacturing process continues according to the processes shown in FIGS. 8b and 9b and the processes described in the Sixth Embodiment to form the passivation layers and the electrodes to make the solar cells as that shown in FIG. 9b.

Twelfth Embodiment

The manufacturing processes of this embodiment are illustrated by FIGS. 1, 3, 4b, 5b, 7b, 7f, 8f and 9f and also based on the descriptions of the Tenth Embodiment.

The processes are carried out according to that described in the Tenth Embodiment to form a PN structure as shown in FIG. 7b. The manufacturing process continues according to the processes described in the Sixth Embodiment to form the passivation layers and the electrodes to make the solar cells as that shown in FIG. 9f.

Thirteenth Embodiment

The manufacturing processes of this embodiment continue by following steps S1 to S4 the First Embodiment as shown in FIGS. 1-3, 4a. Different processes are carried out after step S4.

Referring to FIGS. 5c and 6c that show step S5 wherein boron ions are implanted at an energy of 500 ev through the opening in the open area to form a P+ dopant region 5 and P type transition region 51. The implanting angle is changed between 0 and 1 relative to a perpendicular direction of the N-type substrate 1. As an example, the dopant ions are implanted along direction a2 and gradually decrease until the implant angle is zero along the a1 direction and gradually increased until the implant ions are projected along an a3 direction. Therefore the implant angle 1 can be calculated as $1=\arctan(w_1/h_1)$ where h1 is the vertical depth of the etching process and in this embodiment h1 is the um o the thickness of the blocking layer 3 and the mask 4.

In this configuration, the P+ dopant region 5 is not in contact with the N+ region 2. Because the ions are implanted through the opening of area 21 through the opening of the mask 4 and the blocking layer 3, the P+ region 5 has a width is the narrowest width of the open area 21 and therefore, the P+ region 5 is not in contact with the N+ region 2. In a specific embodiment, the width of the P+ region 5 is about 100 micrometers and the distance between the P+ region 5 and the N+ layer 2 is about 2 micrometers. The bottom surface of the opening area 21 opened by the wet etch process is about 104 micrometers. The manufacturing processes continue with a reflow process generally under 700 degrees Celsius and in specific embodiment, a reflow process is performed at 750 degrees Celsius for 30 minutes to activate the dopant ions.

FIG. 7c shows a step S6 wherein the mask and the blocking layers are removed. A PN structure is formed comprising the P+ dopant region 5, the P-type transition region 51, the N-type substrate 1 and the N+ dopant layer 2 thus a P+/P/N/N+ dopant region configuration form a special PN structure as shown in FIG. 7c. Other processes are carried out according to the First Embodiment.

Fourteenth Embodiment

Referring to FIGS. 1-3, 4a, 5c, 7c, and 7g, and the descriptions of Thirteenth Embodiment, the differences between of this embodiment and Thirteenth Embodiment are the processing steps after FIG. 7c.

Figure 7G:
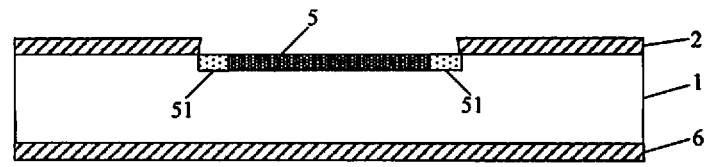

According to FIG. 7g, an N+ dopant region 6 is formed at the backend surface of the substrate. The N+ dopant layer 6 is formed by diffusion of phosphorous ions to form the N+ dopant region 6 having a sheet resistance of 20 ohms/sq with a PN structure shown in FIG. 7g.

Fifteenth Embodiment

The manufacturing processes of this embodiment are illustrated by FIGS. 1-3, 4a, 5c, 7c, and 9c and also based on the descriptions of the Thirteenth Embodiment.

According to FIGS. 1-3, 4a, 5c, 7c, the processes are carried out according to that described in the thirteen Embodiment to form a PN structure as shown in FIG. 7c. The manufacturing process continues according to the processes described in the Sixth Embodiment to form the passivation layers and the electrodes to make the solar cells as that shown in FIG. 9c.

Sixteenth Embodiment

The manufacturing processes of this embodiment are illustrated by FIGS. 1-3, 4a, 5c, 7c, 7g and 9g and also based on the descriptions of the Fourteenth Embodiment.

According to FIGS. 1-3, 4a, 5c, 7c, and 7g, the processes are carried out according to that described in the Thirteen Embodiment to form a PN structure as shown in FIG. 7c. The manufacturing process continues according to the processes described in the Sixth Embodiment to form the passivation layers and the electrodes to make the solar cells as that shown in FIG. 9g.

Seventeenth Embodiment

The manufacturing processes of this embodiment start by following steps S1 to S4 the Ninth Embodiment as shown in FIGS. 1-3, 4b. Different processes are carried out after step S4.

Referring to FIGS. 5d and 6d that show step S5 wherein boron ions are implanted at an energy of 500 ev through the opening in the open area to form a P+ dopant region 5 and P type transition region 51. The implanting angle is changed between 0 and 1 relative to a perpendicular direction of the N-type substrate 1. As an example, the dopant ions are implanted=along a2 and gradually decrease until the implant angle is zero along the a1 direction and gradually increased until the implant ions are projected along an a3 direction. Therefore the implant angle 1 can be calculated as 1=arctan $(w_1/h_1)$ where h1 is the vertical depth of the etching process and in this embodiment h1 is the um o the thickness of the blocking layer 3 and the mask 4.

In this configuration, the P+ dopant region 5 is not in contact with the N+ region 2. Because the ions are implanted through the opening of area 21 through the opening of the mask 4 and the blocking layer 3, the P+ region 5 has a width is the narrowest width of the open area 21 and therefore, the P+ region 5 is not in contact with the N+ region 2. In a specific embodiment, the width of the P+ region 5 is about 100 micrometers and the distance between the P+ region 5 and the N+ layer 2 is about 2 micrometers. The bottom surface of the opening area 21 opened by the wet etch process is about 104 micrometers. The manufacturing processes continue with a reflow process performed at 900 degrees Celsius for 30 minutes to activate the dopant ions.

FIG. 7d shows a step S6 to remove the mask and the blocking layers. A PN structure is formed comprising the P+ dopant region 5, the P-type transition region 51, the N-type substrate 1 and the N+ dopant layer 2 thus a P+/P/N/N+ dopant region configuration form a special PN structure as shown in FIG. 7d.

Eighteenth Embodiment

Referring to FIGS. 1-3, 4b, 5d, 7d, and 7h, and the descriptions of Seventeenth Embodiment, the differences between of this embodiment and Seventeenth Embodiment are the processing steps after FIG. 7d.

Figure 7H:
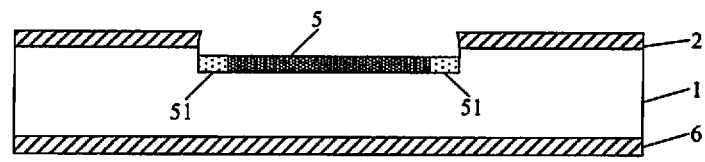

According to FIG. 7h, an N+ dopant region 6 is formed at the backend surface of the substrate. The N+ dopant layer 6 is formed by diffusion of phosphorous ions to form the N+ dopant region 6 having a sheet resistance of 20 ohms/sq with a PN structure shown in FIG. 7g.

Nineteenth Embodiment

The manufacturing processes of this embodiment are illustrated by FIGS. 1-3, 4b, 5d, 7d, 8d and 9d and also based on the descriptions of the Seventeenth Embodiment.

According to the processes are carried out in the Fourteenth Embodiment to form a PN structure as shown in FIG. 7d. The manufacturing process continues according to the processes described in the Sixth Embodiment to form the passivation layers and the electrodes to make the solar cells as that shown in FIG. 9d.

Twentieth Embodiment

The manufacturing processes of this embodiment are illustrated by FIGS. 1-3, 4b, 5d, 7d, 7h, 8h and 9h and also based on the descriptions of the Eighteenth Embodiment. According to the processes are carried out in the Eighteenth Embodiment to form a PN structure as shown in FIG. 7h. The manufacturing process continues according to the processes described in the Sixth Embodiment to form the passivation layers and the electrodes to make the solar cells as that shown in FIG. 9h.

Twenty-First Embodiment

The principles and the practices of this embodiment is the same as Thirteenth Embodiment, and the major processing steps are the same also, the differences are in step S1, the P+ dopant region is formed with a sheet resistance of 40 Ohms/sq.

In step S5, the phosphorous ions are implanted at 500 eV to form the N+ region and N-type transition region wherein the N+ dopant region has a sheet resistance of 120 Ohm/sq.

The sequence of forming the N+ region and P+ region is different from the sequence described in Thirteenth Embodiment. Other than these differences, other processing steps of this embodiment are the same as Thirteenth Embodiment.

Twenty-Second Embodiment

The processes to form the PN structure in this embodiment are the same as the Twenty-first Embodiment. After the completion of the PN structure, the processes o passivation and the formation of the electrodes are carried out according to the Sixth Embodiment.

Twenty-Third Embodiment

Referring to FIGS. 10-12, 13a, 14a wherein another N-type substrate 10 is provided to form another PN structure of this invention.

Figure 10:
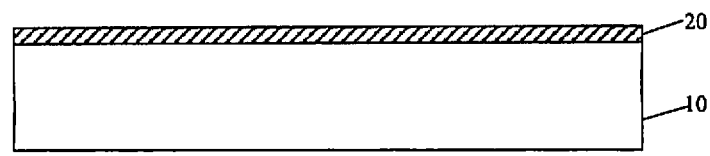
FIGS. 10, 11, 12, 13a, and 13b are a series of cross sectional views for illustrating the processing steps for manufacturing the PN junctions in different embodiments of this invention.

Referring to FIG. 10 that illustrates step S1 wherein an N+ layer 20 is formed in a bottom surface of a N type substrate 10. The sheet resistance of the N+ layer 2 is about 200 Ohm/sq. Specifically, the N+ layer 2 can be formed by implanting phosphorous ions of 500 eV into the N type substrate 10.

Figure 11:
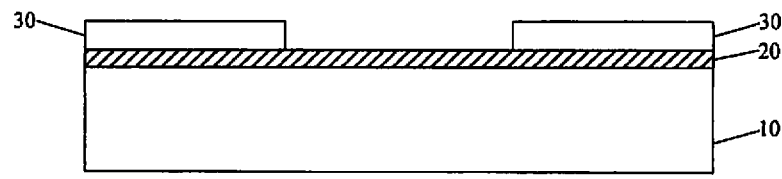

Referring to FIG. 11 for processing step S2 wherein a blocking layer 30 is formed on top of the N+ layer 20. The blocking layer 30 may be formed by applying screen printing process. In one of the embodiments, the blocking layer 30 is a photoresist layer having a thickness of about 10 micrometers. The photoresist layer 30 is deposited and baked dry on top of the substrate 10.

Figure 12:
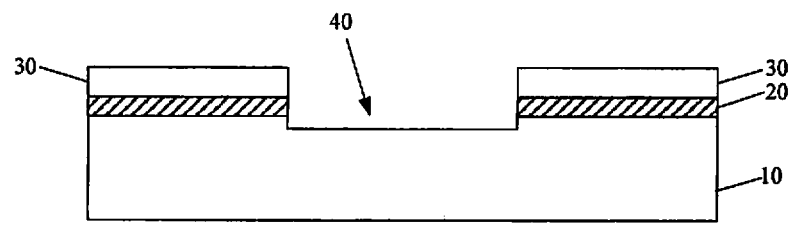

Referring to FIG. 12 for step S3 wherein an etching process is applied to etch off the N+ layer 20 in the open area 21 with a depth greater than the layer thickness of the N+ dopant layer 20. In this embodiment, the etch process reaches into a depth three times the thickness of the N+ dopant layer 20 thus forming a trench 40. The blocking layer 30 protects the N+ layer in the etching process.

Figure 13A:
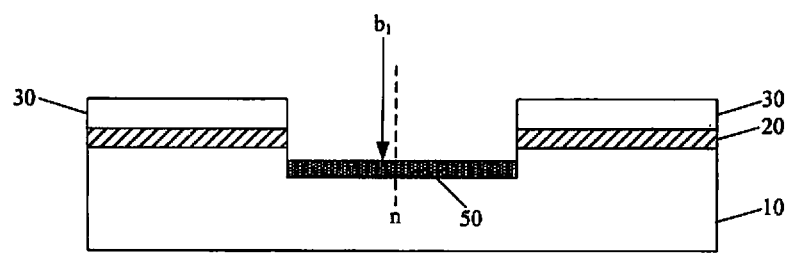

Referring to FIG. 13a for processing step S4 wherein accelerated boron ions at an energy of 500 eV is implanted along a direction b1 to form a P+ dopant region 50. The direction b1 is perpendicular to the bottom surface of the open area wherein the sheet resistance of the P+ region 5, is approximately 40 ohms/cm2. The P+ dopant region 50 is formed below the trench 40 therefore the P+ dopant region 50 is not in contact with the N+ dopant layer 20. The distance between the P+ region 50 from the N+ layer 20 is the depth of the trench 40.

Figure 14A:
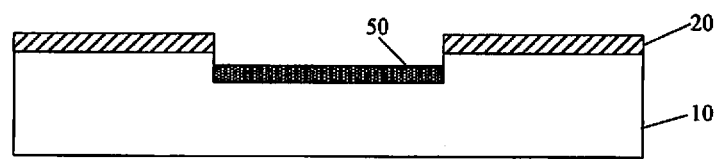
FIGS. 14a to 14d are a set of cross sectional views for showing the processes of removing the mask and forming the PN junctions in the substrate with different configurations as the processing steps implemented in different embodiment described below.

Referring to FIG. 14a for step S5, wherein regular methods are applied to remove the blocking layer 30 and a reflow process at 700 degrees Celsius is performed for 30 minutes. A PN structure comprising P+/N/N+ regions is formed.

Twenty-Fourth Embodiment

The functional and structural principles and the manufacturing processes of this embodiment are the same as the first embodiment. The differences of this embodiment are the selection of different materials and the application of different manufacturing processes parameters.

In step S1, the sheet resistance of the N+ layer 20 is about 200 Ohm/sq. Specifically, the N+ layer 20 is formed by implanting phosphorous ions of 30 KeV into the bottom surface of the N type substrate 1. In step S2, the blocking layer 3 is formed with the photoresist having a thickness of 30 micrometers. In step S3, the trench 40 is formed to have a depth of 5 micrometers. In step S4, the phosphorous ions are accelerated to 50 KeV to perform an perpendicular implant along the b1 direction to form the P+ region 50 having a sheet resistance of 200 Ohm/sq. The reflow process at an temperature of 1100 degrees Celsius is carried out for 30 seconds to activate the dopant ions. Other processing steps are the same as the Twenty-Third embodiment.

Twenty-Fifth Embodiment

The functional and structural principles and the manufacturing processes of this embodiment are the same as the Twenty-third embodiment. The differences of this embodiment are the selection of different materials and the application of different manufacturing processes parameters.

In step S1, the sheet resistance of the N+ layer 20 is about 100 Ohm/sq. Specifically, the N+ layer 20 is formed by implanting phosphorous ions of 50 KeV into the bottom surface of the N type substrate 1. In step S2, the blocking layer 3 is formed with the photoresist having a thickness of 1 micrometer. In step S3, the trench 40 is formed to have a depth of 10 micrometers. In step S4, the phosphorous ions are accelerated to 30 KeV to perform an perpendicular implant along the b1 direction to form the P+ region 50 having a sheet resistance of 120 Ohm/sq. Other processing steps are the same as the Twenty-Third embodiment.

Twenty-Sixth Embodiment

The functional and structural principles and the manufacturing processes of this embodiment are the same as the Twenty-Third Embodiment. The differences of this embodiment are the additional processes that are carried out after the PN structure as shown in FIG. 14a is completed Referring to FIG. 14c, an N+ layer 60 is formed at the backside of the substrate 10 by implanting phosphorous ions to form the N+ layer 60 having a sheet resistance of 20 ohms/sq. The processes of this embodiment thus forming a PN structure as that shown in FIG. 14c.

Twenty-Seventh Embodiment

The description of this embodiment is based on FIGS. 10, 12, 13a and 16a and the Twenty-Third Embodiment.

After making the PN structure shown in FIG. 14a following the processes described in the Twenty-Third Embodiment, further processes are carried out according to the Seventh Embodiment to form the passivation layer shown in FIG. 16a with positive electrode 901 and negative electrode 902 contacting the P+ dopant region 50 and the N+ dopant region 30 respectively. Furthermore, the first and second passivation layers 701 and 702 are amorphous silicon layer and the transparent film 80 is a silicon nitride film.

Twenty-Eighth Embodiment

The description of this embodiment is based on FIGS. 10, 12, 13a, 14a, 14c and 16c and the Twenty-sixth Embodiment.

Figure 14B:
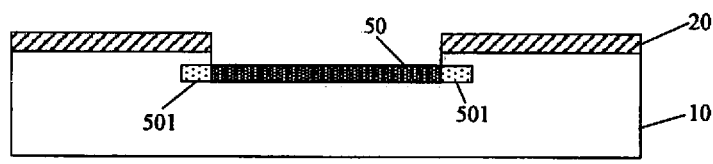
Figure 14C:
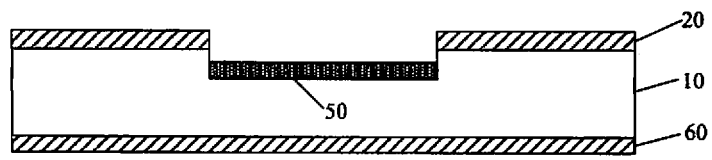

After making the PN structure shown in FIG. 14c following the processes described in the Twenty-sixth Embodiment, further processes are carried out to form the solar cells according to the Seventh Embodiment to form the passivation layer and electrodes shown in FIG. 16c.

Twenty-Ninth Embodiment

Figure 13B:
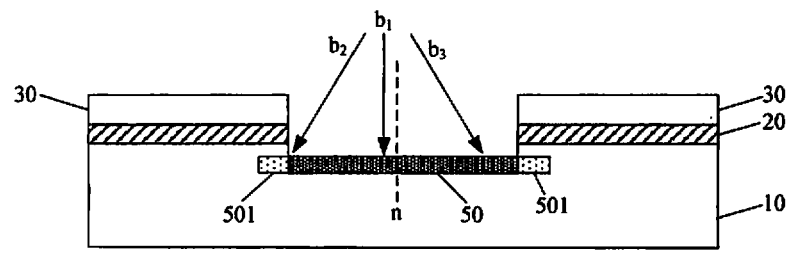

The manufacturing processes of this embodiment are the same with the Twenty-third Embodiment with the following differences:

Referring to FIG. 13b that show step S4 wherein boron ions are implanted at an energy of 500 ev through the opening in the open area to form a P+ dopant region 50 and P type transition region 501. The implanting angle is changed between 0 and 1 relative to a perpendicular direction of the N-type substrate 1. As an example, the dopant ions are implanted with an angle b2 and gradually decrease until the implant angle is zero along the b1 direction and gradually increased until the implant ions are projected along a b3 direction. Therefore the implant operation form a P+ region 50 below the trench 40 at the trench bottom surface and also forming P-type transition regions 501 along the sidewalls of the trench 40. The P+ region 50 is not in contact with N+ region 20. In this embodiment, the P+ region 50 has a sheet resistance about 60 Ohms/sq and the minimum distance between the P+ region 50 and the N+ region 20 is three times of the depth of the P+ region 50 and the angle 1 is 30 degrees.

The processes continue according to FIG. 14b wherein the blocking layer 30 is removed followed by a reflow process at 850 degrees Celsius for twenty minute to activate the dopant ions and a PN structure is formed.

Other processing steps are the same as that described in the Twenty-third Embodiment.

Thirtieth Embodiment

The functional principles and the major processing steps of this embodiment are the same as the twenty-Ninth Embodiment; the differences are the following processing parameters:

In step S2 the blocking layer 30 is formed with photoresist layer having a thickness of 50 micrometers.

In step S3, the depth of the etching process is greater than the depth of the N+ dopant region 20 and the depth etching into the N-type substrate 10 is 5 micrometers.

In step S4, the boron dopant ions are implanted at an energy of 50 KeV with continuous changing implanting angles to form the P dopant region 50 below the trench 40 and P-type transition regions 501 on sidewalls of the trench 40. The sheet resistance of the P+ dopant region is 100 Ohms/sq. The distance between the P+ dopant region 50 and the N+ dopant layer is 5 micrometers and the maximum implanting angle relative the perpendicular direction to the substrate is 20 degrees.

Other processing steps are the same as the Twenty-ninth Embodiment.

Thirty-First Embodiment

Figure 14D:
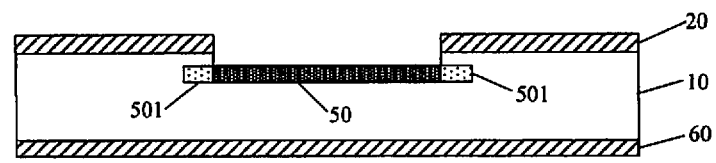
Figure 15A:
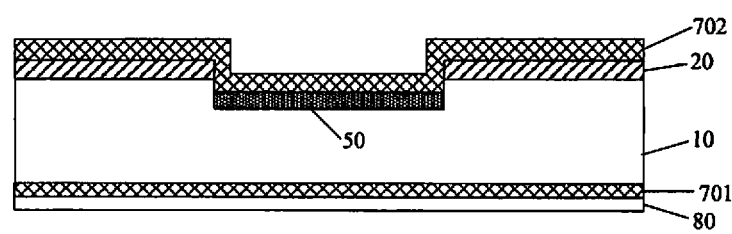
Figure 15B:
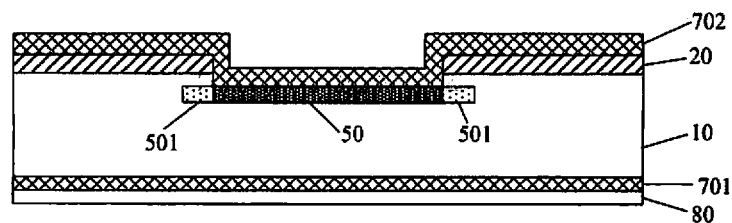
Figure 15C:
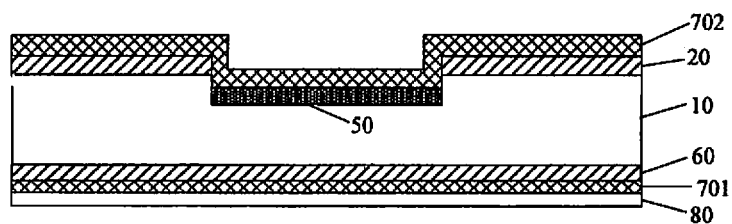

The functional principles and the major processing steps of this embodiment are the same as the twenty-Ninth Embodiment; the differences are the additional processing steps after forming the structure shown in FIG. 14b:

Referring to FIG. 14d, a N+ dopant layer 60 is form at the backside of the substrate by implanting phosphorous ions wherein the sheet resistance of the dopant layer 60 is 120 Ohms/sq to form the PN structure as that shown in FIG. 14d.

Thirty-Second Embodiment

This embodiment is based on the processing steps of Twenty-Ninth Embodiment by referring to FIGS. 10, 11, 12, 13, 14b, 15b and 16b.

The PN structure shown in FIG. 14b is made following the processes of FIGS. 10, 11, 12, 13, 14b, 15b as that described in the Twenty-ninth Embodiment. Additional passivation processes and the formation of the electrodes are carried out based on the Seventh Embodiment to make the solar cells as that shown in FIG. 16b.

Thirty-Three Embodiment

This embodiment is based on the processing steps of Thirty-First Embodiment by referring to FIGS. 10, 11, 12, 13, 14b, 14d, 15d and 16d.

The PN structure shown in FIG. 14d is made following the processes described in the Thirty-First Embodiment. Additional passivation processes and the formation of the electrodes are carried out based on the Seventh Embodiment to make the solar cells as that shown in FIG. 16d.

Thirty-Fourth Embodiment

Referring to FIGS. 20-22, 23a, 24a and 25a wherein another N-type substrate 100 is provided to form another PN structure of this invention.

Referring to FIG. 20 that illustrates step S1 wherein an P+ layer 200 is formed in a bottom surface of a N type substrate 100. The sheet resistance of the P+ layer 2 is about 50 Ohm/sq. Specifically, the P+ layer 200 can be formed by implanting boron ions of 500 eV into the N type substrate 100.

Referring to FIG. 21 for processing step S2 wherein a protective layer 300 is formed on top of the P+ layer 200. The protective layer 300 is formed to protect and cover the protective area from further processes. The protective layer in this embodiment is a silicon dioxide layer having a thickness of 10 micrometers. The area not covered by the protective layer 300 is an open area. Another blocking film 3001 is formed on top of the protective layer 300 wherein the blocking film 300 is a photoresist layer having a thickness of one micrometer.

Figure 23:
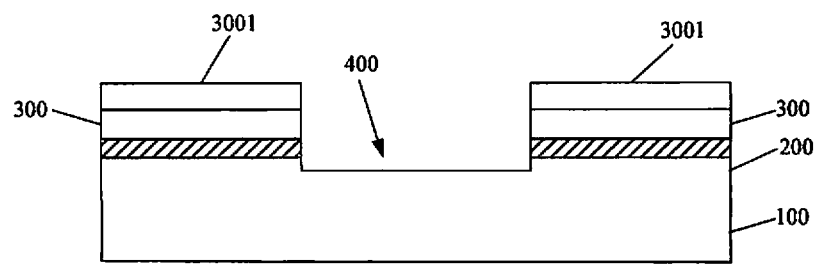

Referring to FIG. 23 for step S3 wherein an etching process is applied to etch off the P+ layer 200 in the open area with a depth greater than the layer thickness of the P+ dopant layer 200. In this embodiment, the etch process reaches into a depth of the N+ dopant layer 100 thus forming a trench 400 having a trench depth of 5 micrometers and a width of the trench 400 is 200 micrometers. The P+ layer 200 that is not etched off constitutes a P+ dopant region.

Figure 24A:
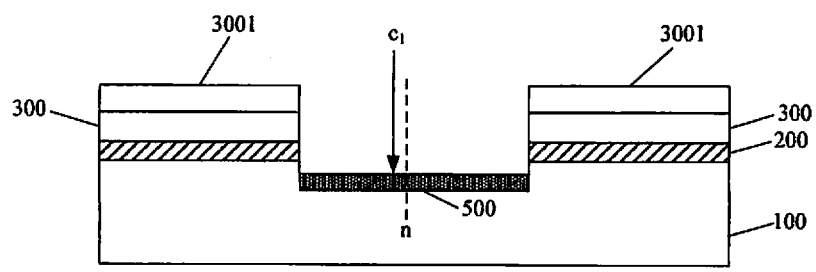

Referring to FIG. 24a for processing step S4 wherein accelerated phosphorous ions at an energy of 500 eV is implanted along a direction c1 to form a N+ dopant region 500. The direction c1 is perpendicular to the bottom surface of the trench 400 wherein the sheet resistance of the N+ region 500 is approximately 60 ohms/sq. The N+ dopant region 500 is formed below the trench 400 therefore the N+ dopant region 500 is not in contact with the P+ dopant layer 200. The distance between the N+ region 500 from the P+ layer 200 is 5 micrometers.

Figure 25A:
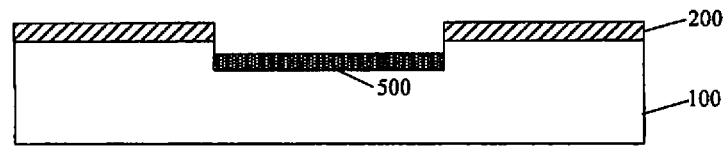
FIGS. 25a to 25d are a set of cross sectional views for showing the processes of removing the mask and forming the PN junctions in the substrate with different configurations as the processing steps implemented in different embodiment described below.

Referring to FIG. 25a for step S5, wherein regular methods are applied to remove the protective layer 300 and the blocking film 3001 followed by a reflow process to make the PN structure shown in FIG. 25a.

Thirty-Fifth Embodiment

The functional and structural principles and the manufacturing processes of this embodiment are the same as the Thirty-fourth Embodiment. The differences of this embodiment are the selection of different materials and the application of different manufacturing processes parameters.

In step S1, the sheet resistance of the P+ layer 200 is about 200 Ohm/sq. Specifically, the P+ layer 200 is formed by implanting boron ions of 50 KeV into the bottom surface of the N type substrate 100. In step S2, the protective layer 300 is formed with the silicon oxide having a thickness of 50 micrometers and the blocking film 3001 is formed with a photoresist layer having a thickness of 50 micrometers. In step S3, the trench 400 is formed to have a depth of 30 micrometers and a width of 400 micrometers. In step S4, the phosphorous ions are accelerated to 50 KeV to perform a perpendicular implant along the b1 direction to form the P+ region 50 having a sheet resistance of 120 Ohm/sq. The distance between the P+ dopant region 200 and the N+ dopant region 500 is 30 micrometers. Other processing steps are the same as the Thirty-Fourth embodiment.

Thirty-Sixth Embodiment

The functional and structural principles and the manufacturing processes of this embodiment are the same as the Thirty-Sixth embodiment. The differences of this embodiment are the selection of different materials and the application of different manufacturing processes parameters.

In step S1, the sheet resistance of the P+ layer 200 is implanted with boron ions of 40 Kev and having a sheet resistance about 100 Ohm/sq.

In step S2, the blocking film 3001 is formed with the photoresist having a thickness of 10 micrometers. In step S3, the trench 400 is formed to have a depth of three times the depth of the P+ layer 200. In step S4, the phosphorous ions are accelerated to 40 KeV to perform an perpendicular implant along the c1 direction to form the N+ region 50 that has a distance from the P+ region 200 three times the thickness of the P+ layer 200. Other processing steps are the same as the Twenty-Third embodiment.

Thirty-Seventh Embodiment

The PN structure of this embodiment is described according to FIGS. 20-23, 24, 25a, and 25c and the Thirty-fourth Embodiment. The functional and structural principles and the manufacturing processes of this embodiment are the same as the Thirty-fourth Embodiment. The differences of this embodiment are the additional processes that are carried out after the PN structure as shown in FIG. 25a is completed Referring to FIG. 25c, an N+ layer 600 is formed at the backside of the substrate 100 by implanting phosphorous ions to form the N+ layer 600. The processes of this embodiment thus forming a PN structure as that shown in FIG. 25c.

Thirty-Eighth Embodiment

The description of this embodiment is based on FIGS. 20-23, 24-27a, and the Thirty-fourth Embodiment.

Figure 27A:
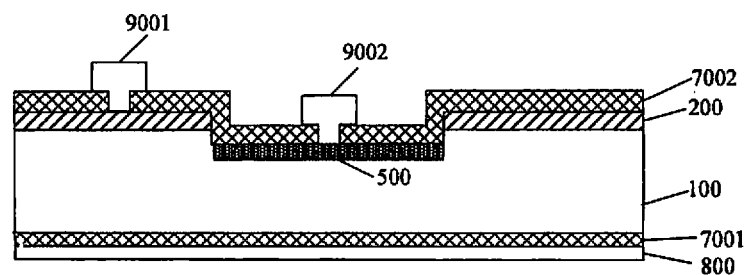
FIGS. 27a to 27d are a set of cross sectional views for showing the processes of opening contact opening in the passivation layer and forming electrodes as the processing steps implemented in different embodiment described below.
Figure 27B:
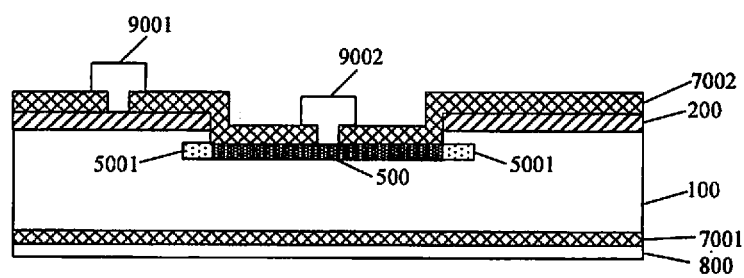

After making the PN structure shown in FIG. 25a following the processes described in the Thirty-fourth Embodiment, further processes are carried out according to the Seventh Embodiment to form the passivation layer shown in FIG. 27a with positive electrode 9001 and negative electrode 9002 contacting the P+ dopant region 300 and the N+ dopant region 500 respectively. Furthermore, the first and second passivation layers 7001 and 7002 are amorphous silicon layer and the transparent film 80 is a silicon nitride film.

Thirty-Ninth Embodiment

The description of this embodiment is based on FIGS. 20-23, 24a-25a, 25c-27c and the Thirty-seventh Embodiment.

Figure 27C:
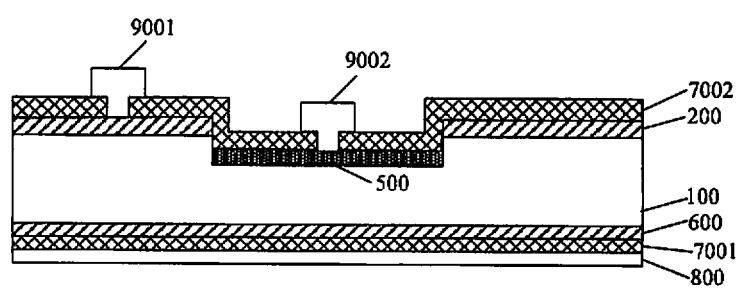
Figure 27D:
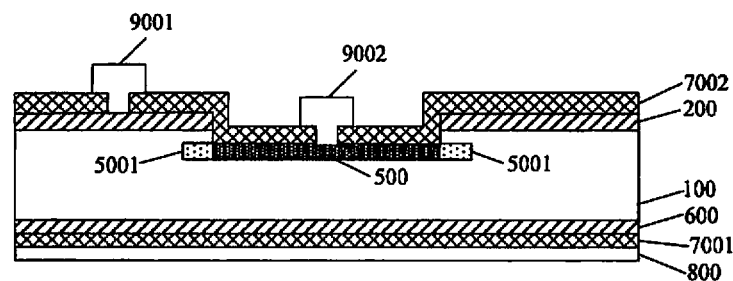

After making the PN structure shown in FIG. 14c following the processes described in the Thirty-seventh Embodiment, further processes are carried out to form the solar cells according to the Seventh Embodiment to form the passivation layer and electrodes shown in FIG. 27c.

Forty Embodiment

The description of the manufacturing processes of this embodiment is based on FIG. 20-23, 24b-25b and the Thirty-fourth Embodiment with the following differences:

The processes of S1 to S3 are carried out to complete the basic structure shown in FIG. 23 as that described in the Thirty-fourth Embodiment.

Figure 24B:
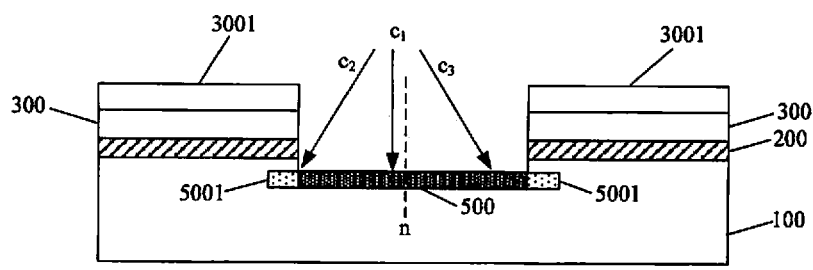

Referring to FIG. 24b for step wherein phosphorous ions are implanted at energy of 500 ev through the opening in the open area to form an N+ dopant region 500 and N type region 5001. The implanting angle is changed between 0 and relative to a perpendicular direction of the N-type substrate 100. As an example, the dopant ions are implanted along direction c2 and gradually decrease until the implant angle is zero along the c1 direction and gradually increased until the implant ions are projected along c3 direction. Therefore the implant operation form a N+ region 500 below the trench 400 at the trench bottom surface and also forming N-type transition regions 5001 along the sidewalls of the trench 400. The N+ region 500 is not in contact with P+ region 200. In this embodiment, the N+ region 500 has a sheet resistance about 40 Ohms/sq and the minimum distance between the P+ region 50 and the N+ region 20 is 5 micrometers.

Figure 25B:
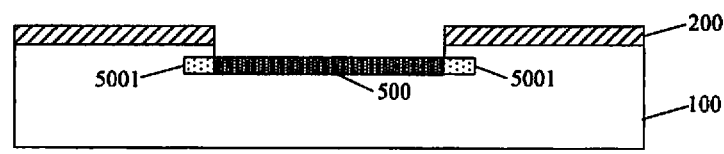
Figure 25C:
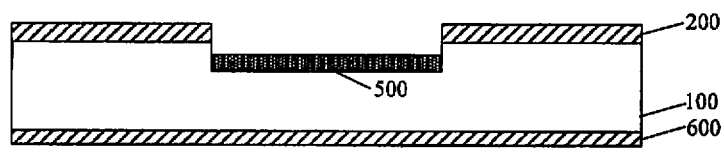

The processes continue according to FIG. 25b that shows step S5 wherein the blocking layer 3001 and protective layer 300 are removed followed by a reflow process at 700 degrees Celsius for 30 minutes to activate the dopant ions and a PN structure is formed.

Other processing steps are the same as that described in the Thirty-Fourth Embodiment.

Forty-First Embodiment

The description of the manufacturing processes of this embodiment is based on FIGS. 20-23, 24b-25b and 25d and the functional and structural principles and the manufacturing processes of this embodiment are the same as the Fortieth Embodiment. The differences of this embodiment are the processes carried out after the completion of the PN structure shown in FIG. 25b.

Figure 25D:
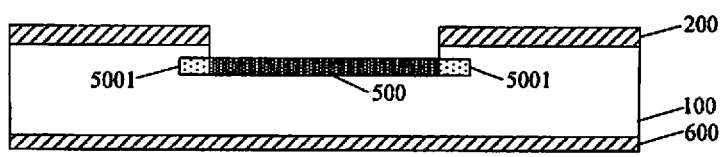
Figure 26A:
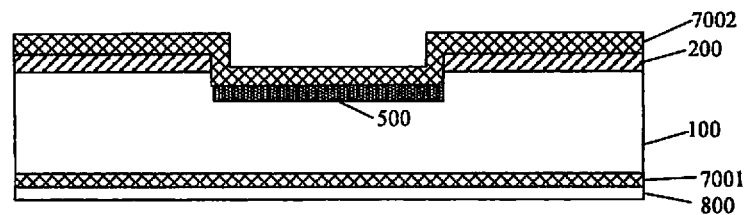
FIGS. 26a to 26d are a set of cross sectional views for showing the processes of forming the passivation layers in the front and back sides of the substrate as the processing steps implemented in different embodiment described below.
Figure 26B:
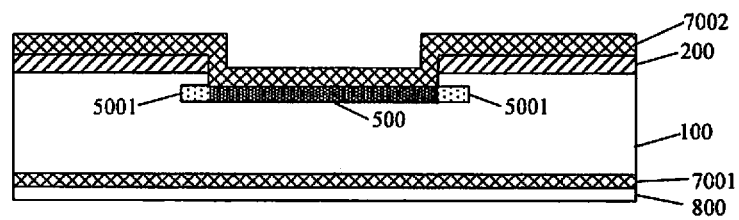
Figure 26C:
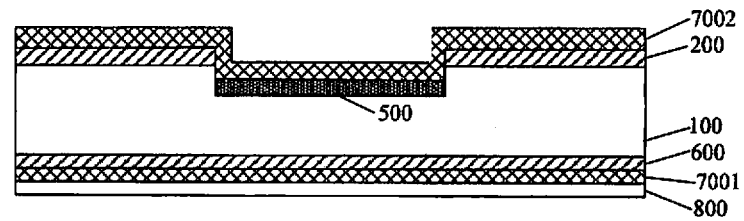
Figure 26D:
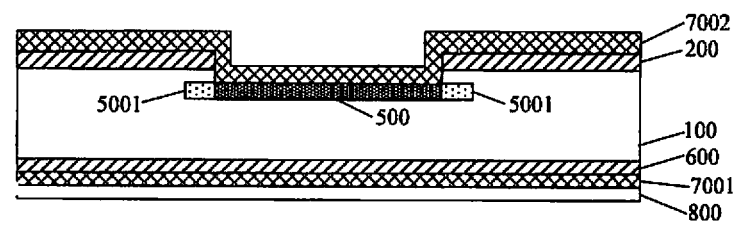

Referring to FIG. 25d, an N+ layer 600 is formed at the backside of the substrate 100 by implanting phosphorous ions to form the N+ layer 600. The processes of this embodiment thus forming a PN structure as that shown in FIG. 25d.

Forty-Second Embodiment

This embodiment is based on the processing steps of Fortieth Embodiment by referring to FIGS. 20-23, 24b-27b and 25d.

The PN structure shown in FIG. 25d is made following the processes described in the Fortieth Embodiment. Additional passivation processes and the formation of the electrodes are carried out based on the Seventh Embodiment to make the solar cells as that shown in FIG. 27b.

Forty-Third Embodiment

The PN structure of this embodiment is described according to FIGS. 20-23, 24b-25b, and 25d-27d and the Forty-first Embodiment. The functional and structural principles and the manufacturing processes of this embodiment are the same as the Forty-first Embodiment. The differences of this embodiment are the additional processes that are carried out after the PN structure as shown in FIG. 25d is completed Additional passivation processes and the formation of the electrodes are carried out based on the Seventh Embodiment to make the solar cells as that shown in FIG. 27d.

Forty-Fourth Embodiment

Referring to FIGS. 30-31, 32a, and 35a wherein another N-type substrate 100 is provided to form another PN structure of this invention.

Figure 30:
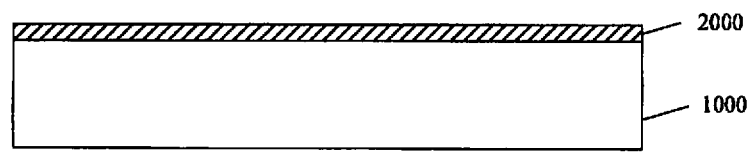
FIGS. 30, 31, 32a to 32b, 33a to 33d are a series of cross sectional views for illustrating the processing steps for manufacturing the PN junctions as that further described in different embodiments of this invention

Referring to FIG. 30 that illustrates step S1 wherein an N+ diffusion layer 2000 is formed in a bottom surface of a N type substrate 1000. Specifically, the N+ layer 2000 is a PSG layer having a thickness of 0.1 micrometer formed by a chemical vapor deposition process (CVD).

Figure 31:
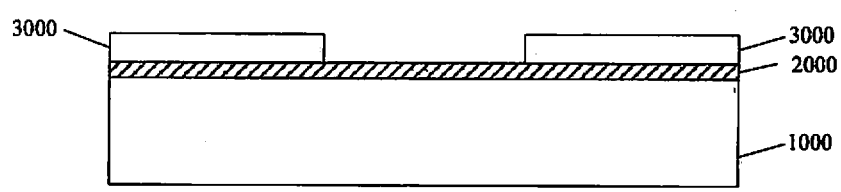
Figure 32A:
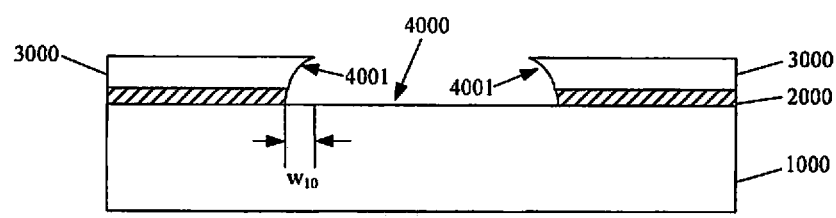

Referring to FIGS. 31 and 32a for processing step S2 wherein a blocking layer 3000 is formed on top of the N+ diffusion layer 2000. The exposed area not covered by the blocking layer 3000 is open area 4000. The blocking layer 3000 in this embodiment is a photoresist layer formed by applying a screen printing process. Referring to FIG. 32a for step S3 wherein an etching process is applied to etch off the N+ diffusion layer 2000 in the open area 4000 with a depth the same as the layer thickness of the P+ dopant layer 2000. In this embodiment, the etch process is an anisotropic wet etching process that etches off a lateral portion 4001 into the N+ diffusion layer near the bottom of the open area 4000. The etch off lateral portion 4001 has a width of 5 micrometers.

Referring to FIG. 33a for processing step S4 wherein accelerated boron ions at an energy of 500 eV is implanted along a direction d1 to form a P+ dopant region 5000 in the N-type substrate 1000. The direction d1 is perpendicular to the bottom surface of the open area 4000 wherein the sheet resistance of the N+ region 5000 is approximately 40 ohms/sq. The P+ dopant region 5000 is formed directly under the open area 4000 having a narrowest width and therefore the P+ dopant region 5000 is not in contact with the N+ diffusion layer 2000. The distance between the N+ region 500 from the P+ layer 200 is 5 micrometers, the opening area 4000 has a width of 100 micrometers and the total width at the bottom of the opening area is 110 micrometers. After the implanting process, a reflow at 1100 degrees Celsius is carried out for 30 seconds to activate the dopant ions.

Figure 35A:
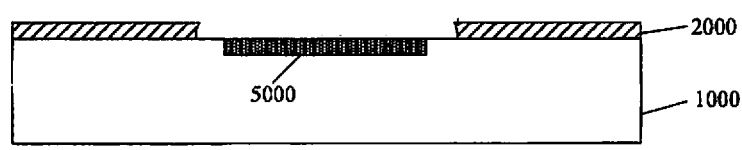
FIGS. 35a to 35x are a set of cross sectional views for showing the processes of removing the mask and forming the PN junctions in the substrate with different configurations as the processing steps implemented in different embodiment described below.

Referring to FIG. 35a for step S5, wherein regular methods are applied to remove the blocking layer 3000 to expose the un-etched N+ diffusion layer 2000 and the P+ dopant region 5000 to form a PN structure as shown in FIG. 35a.

Forty-Fifth Embodiment

The description of the manufacturing processes of this embodiment is based on FIGS. 30-31, 32a-33a, 35a and 35e and the functional and structural principles and the manufacturing processes of this embodiment are the same as the Forty-fourth Embodiment. The differences of this embodiment are the processes carried out after the completion of the PN structure shown in FIG. 35a.

Figure 35B:
Figure 35C:
Figure 35D:
Figure 35E:

Referring to FIG. 35e, an N+ layer 6000 is formed at the backside of the substrate 1000 by implanting phosphorous ions to form the N+ layer 6000. The processes of this embodiment thus forming a PN structure as that shown in FIG. 35e.

Forty-Sixth Embodiment

The description of the manufacturing processes of this embodiment is based on FIGS. 30-31, 32a-33a, 35a and 35i and the functional and structural principles and the manufacturing processes of this embodiment are the same as the Forty-fourth Embodiment. The differences of this embodiment are the processes carried out after the completion of the PN structure shown in FIG. 35a.

Figure 35F:
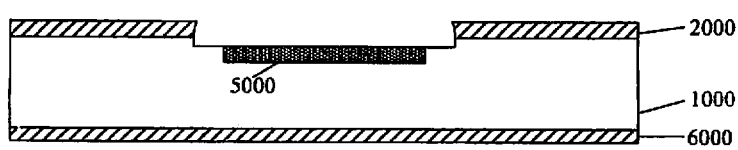
Figure 35G:
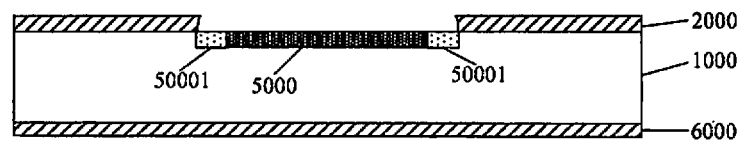
Figure 35H:
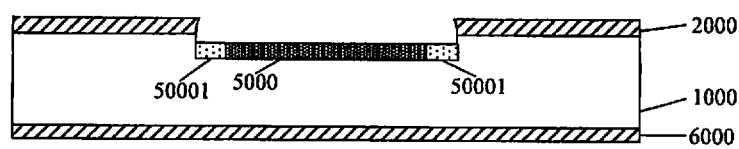
Figure 35I:

Referring to FIG. 35i, a heat process is applied to diffuse the N+ diffusion layer 2000 to form an N+ diffusion region 2001 wherein the N+ diffusion region 2000 and the P+ dopant region 5000 are disposed with a distance of 5 micrometers away and do not contact each other. The heat process is carried out at a temperature of 700 degrees Celsius for 30 minutes and the reactivity of the N+ diffusion region 2001 is 20 Ohms/cm2. The processes of this embodiment thus forming a PN structure as that shown in FIG. 35e.

Forty-Seventh Embodiment

The description of the manufacturing processes of this embodiment is based on FIGS. 30-31, 32a-33a, 35a and 35m.

The functional and structural principles and the manufacturing processes of this embodiment are the same as the Forty-fourth Embodiment. The differences of this embodiment are the processes carried out after the completion of the PN structure shown in FIG. 35a.

Figure 35J:
Figure 35K:
Figure 35L:
Figure 35M:
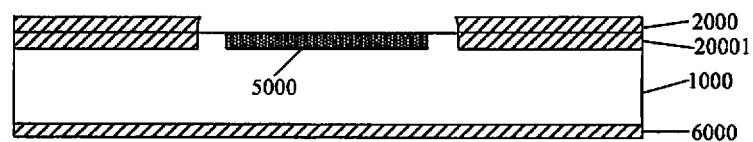

Referring to FIG. 35m, a heat process is applied to diffuse the N+ diffusion layer 2000 to form an N+ diffusion region 2001 wherein the N+ diffusion region 2000 and the P+ dopant region 5000 are disposed with a distance of 5 micrometers away and do not contact each other. In the meantime the heat process also causes the phosphorous dopant layer 6000 to diffuse thus forming a PN structure as that shown in FIG. 35m.

Forty-Eighth Embodiment

The description of the manufacturing processes of this embodiment is based on FIGS. 30-31, 32a-33a, 35a and 35q.

The functional and structural principles and the manufacturing processes of this embodiment are the same as the Forty-sixth Embodiment. The differences of this embodiment are the processes carried out after the completion of the PN structure shown in FIG. 35i.

Figure 35N:
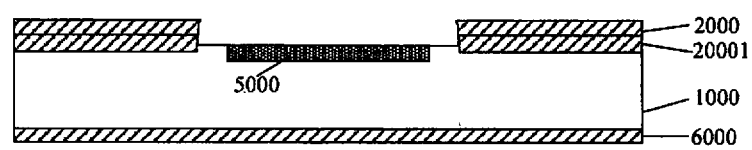
Figure 35O:
Figure 35P:
Figure 35Q:

Referring to FIG. 35q, the N+ diffusion layer 2000 that is not etched off is removed wherein the diffusion region 2001 provides the function of N− region to constitute a PN structure as that shown in FIG. 35q.

Forty-Ninth Embodiment

The description of the manufacturing processes of this embodiment is based on FIG. 30-31, 32a-33a, 35a, 35m and 35u.

The functional and structural principles and the manufacturing processes of this embodiment are the same as the Forty-seventh Embodiment. The differences of this embodiment are the processes carried out after the completion of the PN structure shown in FIG. 35m.

Figure 35R:
Figure 35S:
Figure 35T:
Figure 35U:

Referring to FIG. 35u, the N+ diffusion layer 2000 that is not etched off is removed wherein the diffusion region 2001 provides the function of N region to constitute a PN structure as that shown in FIG. 35u.

Fiftieth Embodiment

The description of the manufacturing processes of this embodiment is based on FIGS. 30-31, 32a, 37a, 35m and 35u.

Figure 37A:
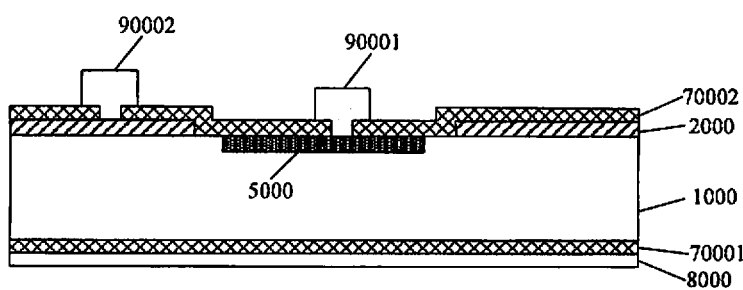
FIGS. 37a to 37x are a set of cross sectional views for showing the processes of opening contact opening in the passivation layer and forming electrodes as the processing steps implemented in different embodiment described below.

After making the PN structure shown in FIG. 35a following the processes described in the Forty-fourth Embodiment, further processes are carried out according to the Seventh Embodiment to form the passivation layer shown in FIG. 37a with positive electrode 90001 and negative electrode 90002 contacting the P+ dopant region 5000 and the N+ dopant region 2000 respectively. Furthermore, the first and second passivation layers 70001 and 70002 are amorphous silicon layer and the transparent film 80 is a silicon nitride film.

Fifty-First Embodiment

The description of the manufacturing processes of this embodiment is based on FIGS. 30-31, 32a, 33a, 35a and 35e-37e.

Figure 37B:
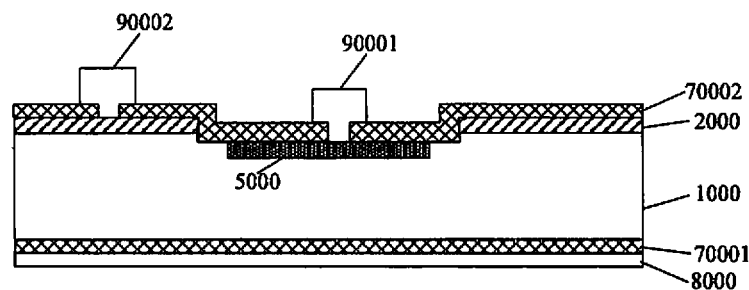
Figure 37C:
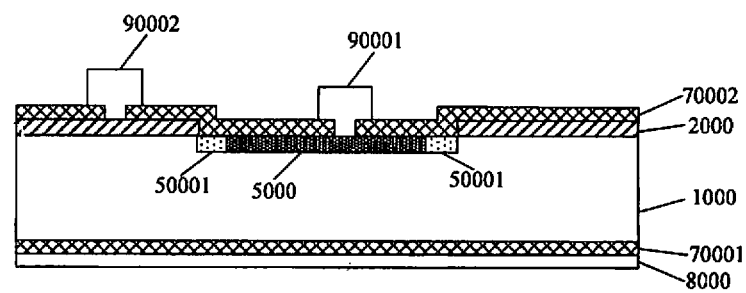
Figure 37D:
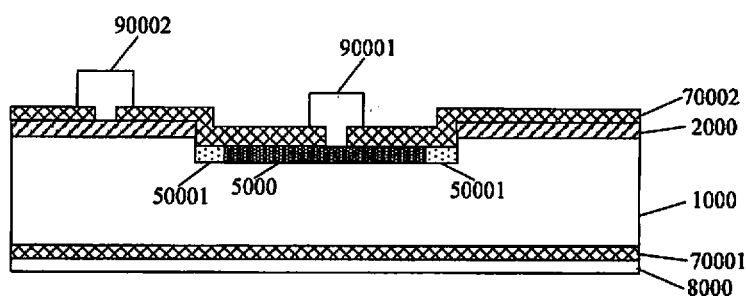
Figure 37E:
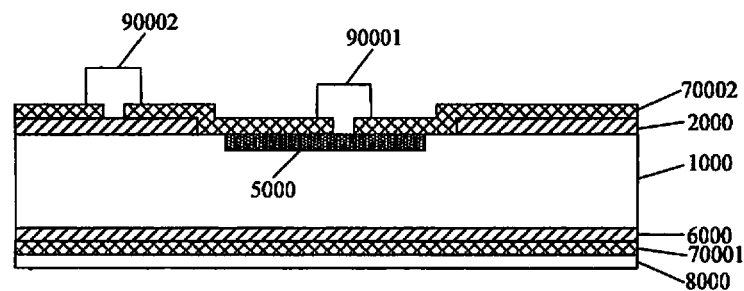

After making the PN structure shown in FIG. 35e following the processes described in the Forty-fifth Embodiment, further processes are carried out according to the Seventh Embodiment to form the passivation layer shown in FIG. 37e with positive electrode 90001 and negative electrode 90002 contacting the P+ dopant region 5000 and the N+ dopant region 2000 respectively. Furthermore, the first and second passivation layers 70001 and 70002 are amorphous silicon layer and the transparent film 80 is a silicon nitride film.

Fifty-Second Embodiment

The description of the manufacturing processes of this embodiment is based on FIGS. 30-31, 32a, 33a, 35a and 35i-37i.

Figure 37F:
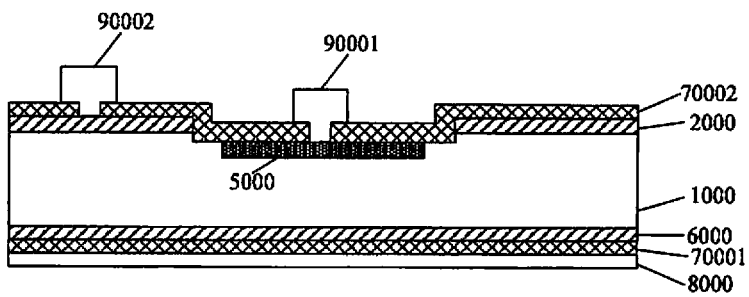
Figure 37G:
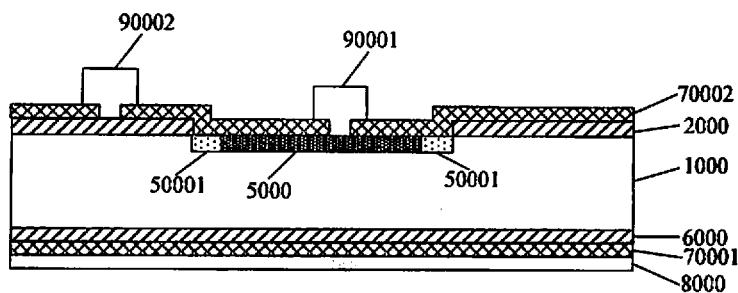
Figure 37H:
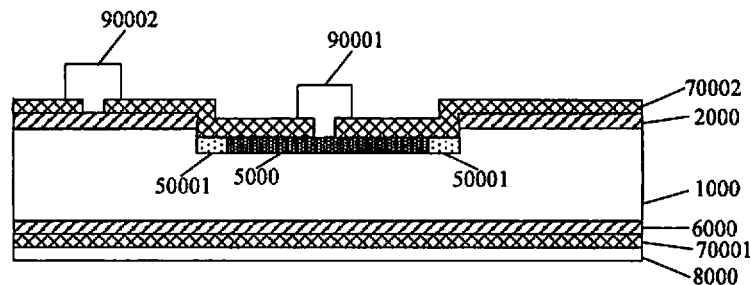
Figure 37I:
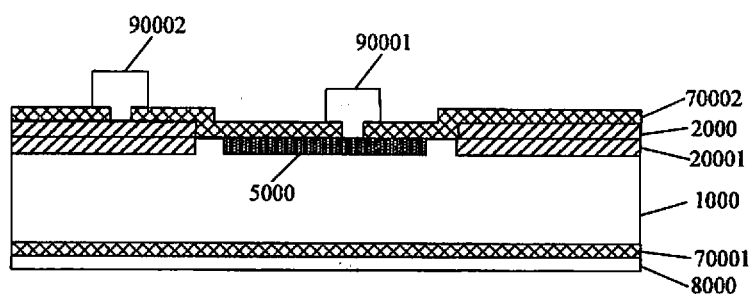

After making the PN structure shown in FIG. 35i following the processes described in the Forty-sixth Embodiment, further processes are carried out according to the Seventh Embodiment to form the passivation layer shown in FIG. 37i with positive electrode 90001 and negative electrode 90002 contacting the P+ dopant region 5000 and the N+ dopant region 2000 respectively.

Fifty-Third Embodiment

The description of the manufacturing processes of this embodiment is based on FIGS. 30-31, 32a, 33a, 35a and 35m-37m.

Figure 37J:
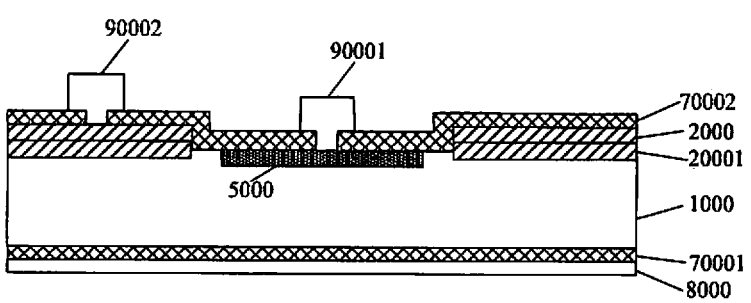
Figure 37K:
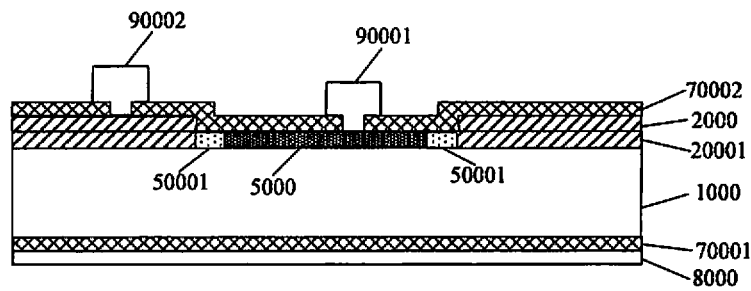
Figure 37L:
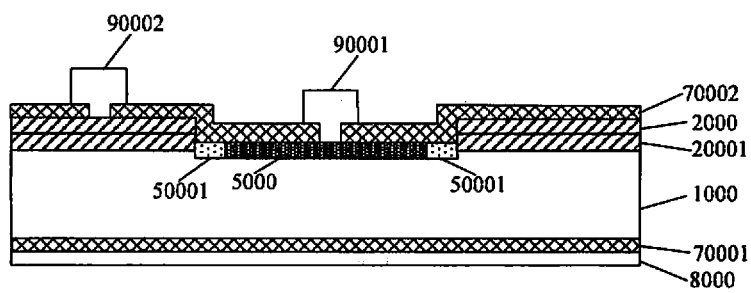
Figure 37M:
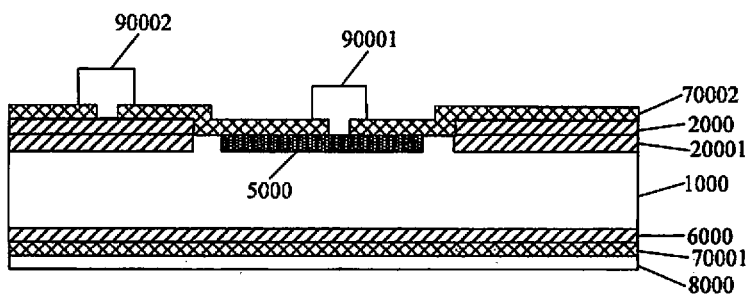

After making the PN structure shown in FIG. 35i following the processes described in the Forty-seventh Embodiment, further processes are carried out according to the Seventh Embodiment to form the passivation layer shown in FIG. 37m with positive electrode 90001 and negative electrode 90002 contacting the P+ dopant region 5000 and the N+ dopant region 20001 respectively.

Fifty-Forth Embodiment

The description of the manufacturing processes of this embodiment is based on FIGS. 30-31, 32a, 33a, 35a and 35q-37q.

Figure 37N:
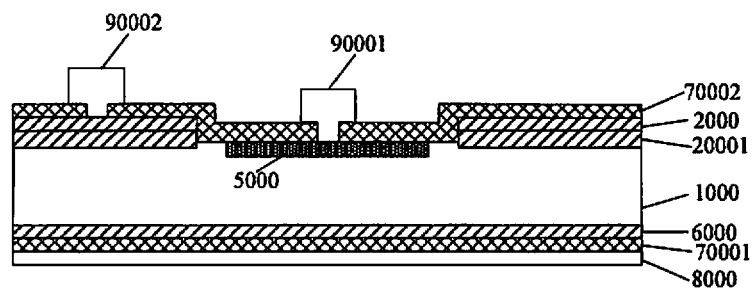
Figure 37O:
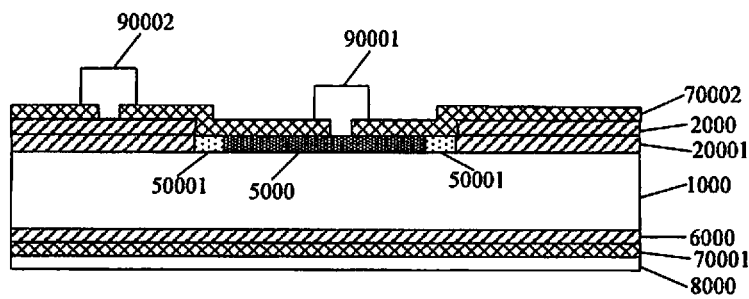
Figure 37P:
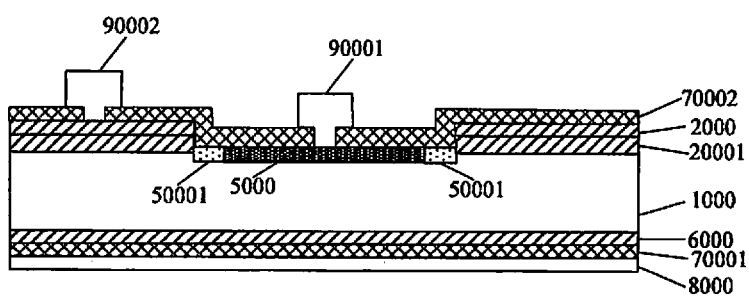
Figure 37Q:
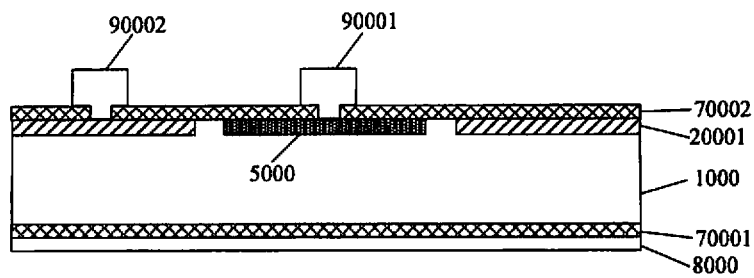

After making the PN structure shown in FIG. 35i following the processes described in the Forty-eighth Embodiment, further processes are carried out according to the Seventh Embodiment to form the passivation layer shown in FIG. 37q with positive electrode 90001 and negative electrode 90002 contacting the P+ dopant region 5000 and the N+ dopant region 20001 respectively.

Fifty-Fifth Embodiment

The description of the manufacturing processes of this embodiment is based on FIGS. 30-31, 32a, 33a, 35a and 35u-37u.

After making the PN structure shown in FIG. 35u following the processes described in the Forty-ninth Embodiment, further processes are carried out according to the Seventh Embodiment to form the passivation layer shown in FIG. 37q with positive electrode 90001 and negative electrode 90002 contacting the p+ dopant region 5000 and the N+ dopant region 20001 respectively.

Fifty-Sixth Embodiment

The description of the manufacturing processes of this embodiment is based on FIGS. 30-31, 32b, 33b, and 35b.

Figure 32B:
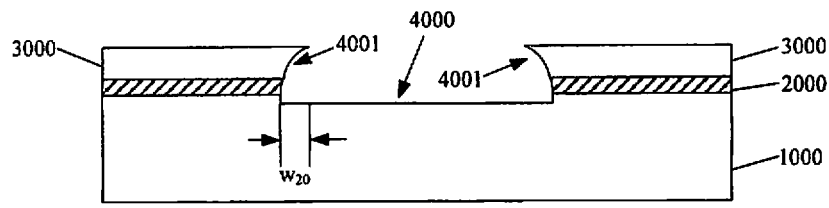

The description of the manufacturing processes of this embodiment is based on the Forty-fourth Embodiment with the following differences:

Referring to FIG. 32b for step S3 wherein the diffusion layer 2000 in the open area 4000 is removed, the etch process that applies HF etchant to carry out a wet etch further removes a lateral portion 4001 that has a width of 5 micrometers. The depth of the etching process is greater than the N+ diffusion layer. A top portion of the N-type substrate 1000 is also etched off thus forming a shallow trench at the bottom of the open area 4000.

Referring to FIG. 33b for step S4 wherein boron ions of 50 KeV are implanted along a d1 direction to perpendicularly implant a P+ region 5000 having a sheet resistance of 200 Ohms/sq below the bottom surface of the trench at the bottom of the open area 4000.

Referring to FIG. 35b for step S5 wherein the blocking layer 3000 is removed thus exposed the N+ layer 2000 that is not etched off and the P+ region 5000 to form a PN structure as that shown in FIG. 35b wherein the N+ diffusion layer 2000 that is not etched off functions as the N region.

Fifty-Seventh Embodiment

The description of the manufacturing processes of this embodiment is based on FIGS. 30-31, 32a-33a, 35b and 35f and the functional and structural principles and the manufacturing processes of this embodiment are the same as the Fifty-Sixth Embodiment. The differences of this embodiment are the processes carried out after the completion of the PN structure shown in FIG. 35b.

Referring to FIG. 35f, an N+ layer 6000 is formed at the backside of the substrate 1000 by implanting phosphorous ions to form the N+ layer 6000. The processes of this embodiment thus forming a PN structure as that shown in FIG. 35f.

Fifty-Eighth Embodiment

The description of the manufacturing processes of this embodiment is based on FIGS. 30-31, 32b, 33b, 35b and 35j.

After making the PN structure shown in FIG. 35b following the processes described in the Fifty-sixth Embodiment, further processes are carried out according to the FIG. 35j wherein a heat process with a temperature of 900 degrees Celsius for 20 minutes, is applied to diffuse the diffusion layer 2000 to form N+ diffusion region 20001 and wherein the N+ diffusion region 20001, having a sheet resistance of 200 Ohms/sq, and the P+ dopant region 5000 are separated with a distance of five micrometers. The diffusion region 20001 and the N+ layer 2000 that is not etched off function together as the N-region for the PN structure.

Fifty-Ninth Embodiment

The description of the manufacturing processes of this embodiment is based on FIGS. 30-31, 32b, 33b, 35b and 35n.

After making the PN structure shown in FIG. 35b following the processes described in the Fifty-sixth Embodiment, further processes are carried out according to the FIG. 35n wherein a heat process is applied to diffuse the diffusion layer 2000 to form N+ diffusion region 20001 and wherein the N+ diffusion region 20001 and the P+ dopant region 5000 are separated. The diffusion region 20001 and the N+ layer 2000 that is not etched off function together as the N-region for the PN structure. In the meantime the N+ dopant layer 6000 at the second surface of the substrate is also diffused by the heat process to form a PN structure shown in FIG. 35n.

Sixtieth Embodiment

The description of the manufacturing processes of this embodiment is based on FIGS. 30-31, 32b, 33b, 35b, 35j and 35r.

After making the PN structure shown in FIG. 35j following the processes described in the Fifty-eighth Embodiment, further processes are carried out according to the FIG. 35r wherein the N+ diffusion layer not removed by the etch process is removed and wherein the N+ diffusion region 20001 and the P+ dopant region 5000 are separated. The diffusion region 20001 and the N+ layer 2000 that is not etched off function together as the N-region for the PN structure.

Sixty-First Embodiment

The description of the manufacturing processes of this embodiment is based on FIGS. 30-31, 32b, 33b, 35b, 35n and 35v.

Figure 35V:

After making the PN structure shown in FIG. 35j following the processes described in the Fifty-ninth Embodiment, further processes are carried out according to the FIG. 35v wherein the N+ diffusion layer not removed by the etch process is removed and wherein the N+ diffusion region 20001 and the P+ dopant region 5000 are separated. The diffusion region 20001 and the N+ layer 2000 that is not etched off function together as the N-region for the PN structure.

Sixty-Second Embodiment

The description of the manufacturing processes of this embodiment is based on FIG. 30-31, 32b, 37b, and the Fifty-sixth Embodiment.

After making the PN structure shown in FIG. 35b following the processes described in the Fifty-sixth Embodiment, further processes are carried out according to the Seventh Embodiment to form the passivation layer shown in FIG. 37b with positive electrode 90001 and negative electrode 90002 contacting the P+ dopant region 5000 and the N+ dopant region 2000 respectively. Furthermore, the first and second passivation layers 70001 and 70002 are amorphous silicon layer and the transparent film 8000 is a silicon nitride film.

Sixty-Third Embodiment

The description of the manufacturing processes of this embodiment is based on FIGS. 30-31, 32b, 33b, 35b, 35f and 37f the Fifty-seventh Embodiment.

After making the PN structure shown in FIG. 35f following the processes described in the Fifty-seventh Embodiment, further processes are carried out according to the Seventh Embodiment to form the passivation layer shown in FIG. 37f with positive electrode 90001 and negative electrode 90002 contacting the P+ dopant region 5000 and the N+ dopant diffusion region 20001 respectively.

Sixty-Forth Embodiment

The description of the manufacturing processes of this embodiment is based on FIGS. 30-31, 32b, 33b, 35b, 35j and 37j the Fifty-eighth Embodiment.

After making the PN structure shown in FIG. 35j following the processes described in the Fifty-eighth Embodiment, further processes are carried out according to the Seventh Embodiment to form the passivation layer shown in FIG. 37j with positive electrode 90001 and negative electrode 90002 contacting the P+ dopant region 5000 and the N+ dopant diffusion region 20001 respectively.

Sixty-Fifth Embodiment

The description of the manufacturing processes of this embodiment is based on FIGS. 30-31, 32b, 33b, 35b, 35n and 37n the Fifty-eighth Embodiment.

After making the PN structure shown in FIG. 35n following the processes described in the Fifty-eighth Embodiment, further processes are carried out according to the Seventh Embodiment to form the passivation layer shown in FIG. 37n with positive electrode 90001 and negative electrode 90002 contacting the P+ dopant region 5000 and the N+ dopant diffusion region 20001 respectively.

Sixty-Sixth Embodiment

The description of the manufacturing processes of this embodiment is based on FIGS. 30-31, 32b, 33b, 35b, 35r and 37r the Sixtieth Embodiment.

Figure 37R:
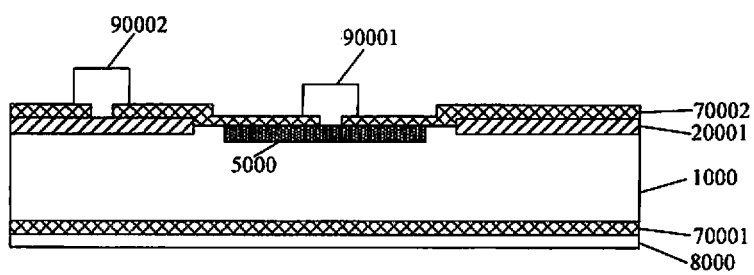

After making the PN structure shown in FIG. 35r following the processes described in the Sixtieth Embodiment, further processes are carried out according to the Seventh Embodiment to form the passivation layer shown in FIG. 37r with positive electrode 90001 and negative electrode 90002 contacting the P+ dopant region 5000 and the N+ dopant diffusion region 20001 respectively.

Sixty-Seventh Embodiment

The description of the manufacturing processes of this embodiment is based on FIGS. 30-31, 32b, 33b, 35b, 35v and 37v the Sixtieth Embodiment.

Figure 37S:
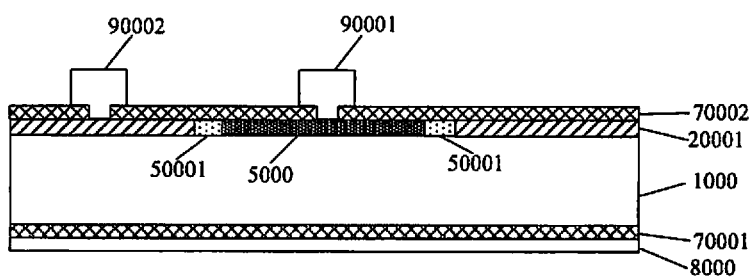
Figure 37T:
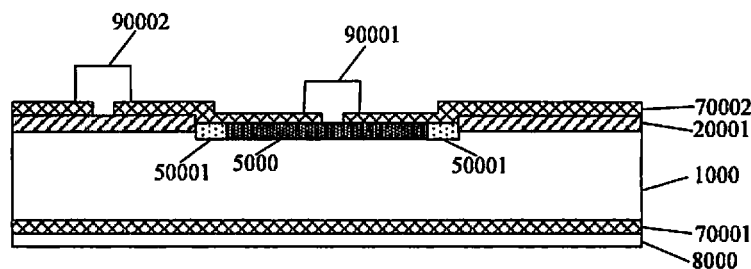
Figure 37U:
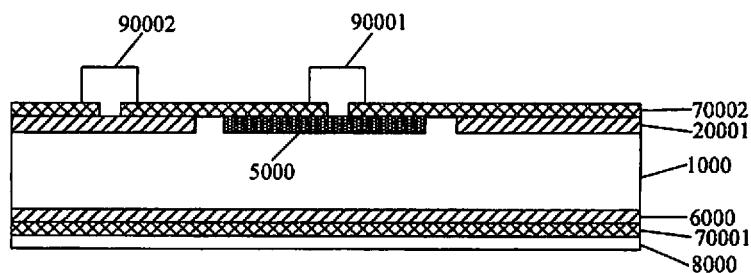
Figure 37V:
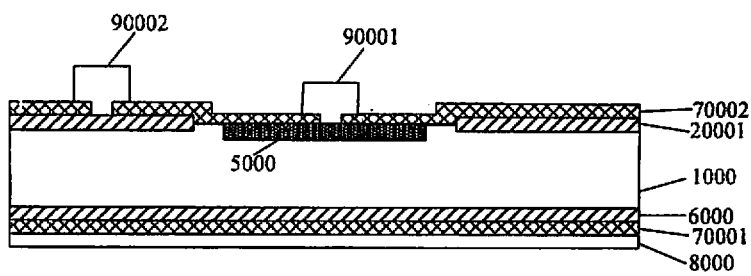

After making the PN structure shown in FIG. 35v following the processes described in the Sixtieth Embodiment, further processes are carried out according to the Seventh Embodiment to form the passivation layer shown in FIG. 37v with positive electrode 90001 and negative electrode 90002 contacting the P+ dopant region 5000 and the N+ dopant diffusion region 20001 respectively.

Sixty-Eighth Embodiment

The description of the manufacturing processes of this embodiment is based on FIG. 30-31, 32a, 33c, 35c, for making another PN structure.

The processes of this embodiment are the same as Forty-forth Embodiment and the differences are the selection of the processing parameters.

Referring to FIG. 33c for step S4 wherein boron ions are implanted at energy of 30 KeV through the opening in the open area to form a P+ dopant region 5000 and P type transition region 50001. The implanting angle is changed between 0 and relative to a perpendicular direction of the N-type substrate 1000. As an example, the dopant ions are implanted along direction d2 and gradually decrease until the implant angle is zero along the d1 direction and gradually increased until the implant ions are projected along d3 direction. Therefore the implant operation forms a P+ region 5000 at the bottom surface of the open area and also forming P-type transition regions 50001. The implant angle 1 can be calculated as $1=\arctan(w_1/h_{10})$ where h10 is the vertical depth of the etching process.

The processes continue according to FIG. 35c that shows step S5 wherein the blocking layer 3000 is removed to exposed the N+ diffusion layer 2000 and P+ dopant region 50000 and the P+ transition region 50001 to make a PN structure as that shown in FIG. 35c wherein the N+ diffusion layer 2000 that is not etched off is the N+ dopant region for the PN structure.

Sixty-Ninth Embodiment

The description of the manufacturing processes of this embodiment is based on FIGS. 30-31, 32a-33c, 35c and 35g and the functional and structural principles and the manufacturing processes of this embodiment are the same as the Sixty-eighth Embodiment. The differences of this embodiment are the processes carried out after the completion of the PN structure shown iii FIG. 35c.

Referring to FIG. 35g, an N+ layer 6000 is formed at the backside of the substrate 1000 by implanting phosphorous ions to form the N+ layer 6000. The processes of this embodiment thus forming a PN structure as that shown in FIG. 35g.

Seventieth Embodiment

The description of the manufacturing processes of this embodiment is based on FIGS. 30-31, 32a-33c, 35c and 35k and the functional and structural principles and the manufacturing processes of this embodiment are the same as the Sixty-eighth Embodiment. The differences of this embodiment are the processes carried out after the completion of the PN structure shown in FIG. 35c including the diffusion layer 2000 and the P+ dopant region 50000 and P+ transition region 50001.

Referring to FIG. 35k, a heat process is carried out to diffuse the N+ dopant layer 2000 that is not etched off to form N+ diffusion region 20001 wherein the P+ dopant region and the P+ transition region 20001 are separated. The heat process is carried out at 900 degrees Celsius for 10 minutes wherein the N+ diffusion region has a sheet resistance at 200 Ohms/sq. The N+ diffusion layer 2000 and the N+ diffusion region 20001 function together as N+ dopant region.

Seventy-First Embodiment

The description of the manufacturing processes of this embodiment is based on FIGS. 30-31, 32a-33c, 35c and 35o and the functional and structural principles and the manufacturing processes of this embodiment are the same as the Sixty-eighth Embodiment. The differences of this embodiment are the processes carried out after the completion of the PN structure shown in FIG. 35c including the diffusion layer 2000 and the P+ dopant region 50000 and P+ transition region 50001.

Referring to FIG. 35o, a heat process is carried out to diffuse the N+ dopant layer 2000 that is not etched off to form N+ diffusion region 20001 wherein the P+ dopant region and the P+ transition region 20001 are separated. The heat process is carried out to diffuse the N+ diffusion layer to diffuse the phosphorous ions to form a N+ dopant region 60000 to make a PN structure as that shown in FIG. 35o.

Seventy-Second Embodiment

The description of the manufacturing processes of this embodiment is based on FIG. 30-31, 32a-33c, 35c, 35k and 35s.

The functional and structural principles and the manufacturing processes of this embodiment are the same as the Seventieth Embodiment. The differences of this embodiment are the processes carried out after the completion of the PN structure shown in FIG. 35k.

Referring to FIG. 35s, a heat process is carried out to diffuse the N+ dopant layer 2000 that is not etched off to form N+ diffusion region 20001 to make a PN structure as that shown in FIG. 35s.

Seventy-Third Embodiment

The description of the manufacturing processes of this embodiment is based on FIG. 30-31, 32a-33c, 35c, 35o and 35w.

The functional and structural principles and the manufacturing processes of this embodiment are the same as the Seventy-first Embodiment. The differences of this embodiment are the processes carried out after the completion of the PN structure shown in FIG. 35o.

Figure 35W:

Referring to FIG. 35w, a heat process is carried out to diffuse the N+ dopant layer 2000 that is not etched off to form N+ diffusion region 20001 to make a PN structure as that shown in FIG. 35w.

Seventy-Forth Embodiment

The description of the manufacturing processes of this embodiment is based on FIGS. 30-31, 32a-33c, 35c, and 37c and the Sixty-eighth Embodiment.

After making the PN structure shown in FIG. 35c following the processes described in the Sixty-eighth Embodiment, further processes are carried out according to the Seventh Embodiment to form the passivation layer shown in FIG. 37c with positive electrode 90001 and negative electrode 90002 contacting the P+ dopant region 5000 and the N+ dopant region 2000 respectively. Furthermore, the first and second passivation layers 7001 and 7002 are amorphous silicon layer and the transparent film 80 is a silicon nitride film.

Seventy-Fifth Embodiment

The description of the manufacturing processes of this embodiment is based on FIGS. 30-31, 32a-33c, 35g, and 37g and the Sixty-ninth Embodiment.

After making the PN structure shown in FIG. 35g following the processes described in the Sixty-ninth Embodiment, further processes are carried out according to the Seventh Embodiment to form the passivation layer shown in FIG. 37g with positive electrode 90001 and negative electrode 90002 contacting the P+ dopant region 5000 and the N+ dopant region 2000 respectively.

Seventy-Sixth Embodiment

The description of the manufacturing processes of this embodiment is based on FIGS. 30-31, 32a-33c, 35k, and 37k and the Seventieth Embodiment.

After making the PN structure shown in FIG. 35k following the processes described in the Seventieth Embodiment, further processes are carried out according to the Seventh Embodiment to form the passivation layer shown in FIG. 37k with positive electrode 90001 and negative electrode 90002 contacting the P+ dopant region 5000 and the N+ dopant region 2000 respectively.

Seventy-Seventh Embodiment

The description of the manufacturing processes of this embodiment is based on FIGS. 30-31, 32a-33c, 35o, and 37o and the Seventy-first Embodiment.

After making the PN structure shown in FIG. 35o following the processes described in the Seventy-first Embodiment, further processes are carried out according to the Seventh Embodiment to form the passivation layer shown in FIG. 37o with positive electrode 90001 and negative electrode 90002 contacting the P+ dopant region 5000 and the N+ dopant region 2000 respectively.

Seventy Eighth Embodiment

The description of the manufacturing processes of this embodiment is based on FIG. 30-31, 32a-33c, 35c, 35k, 35s, and 37s and the Seventy-second Embodiment.

After making the PN structure shown in FIG. 35s following the processes described in the Seventy-second Embodiment, further processes are carried out according to the Seventh Embodiment to form the passivation layer shown in FIG. 37s with positive electrode 90001 and negative electrode 90002 contacting the P+ dopant region 5000 and the N+ dopant region 2000 respectively.

Seventy-Ninth Embodiment

The description of the manufacturing processes of this embodiment is based on FIG. 30-31, 32a-33c, 35c, 35o, 35w, and 37w and the Seventy-third Embodiment.

Figure 37W:
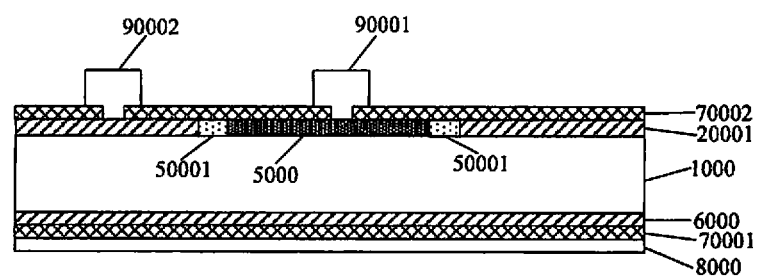

After making the PN structure shown in FIG. 35w following the processes described in the Seventy-third Embodiment, further processes are carried out according to the Seventh Embodiment to form the passivation layer shown in FIG. 37w with positive electrode 90001 and negative electrode 90002 contacting the P+ dopant region 5000 and the N+ dopant region 2000 respectively.

Eightieth Embodiment

The description of the manufacturing processes of this embodiment is based on FIG. 30-31, 32b, 33d, 35d, and Fifty-sixth embodiment for making another PN structure.

The processes of this embodiment are the same as Fifty-sixth Embodiment and the differences are the selection of the processing parameters.

Referring to FIG. 33d for step S4 wherein boron ions are implanted at energy of 40 KeV through the opening in the open area to form a P+ dopant region 5000 and P type transition region 50001. The implanting angle is changed between 0 and relative to a perpendicular direction of the N-type substrate 1000. As an example, the dopant ions are implanted along direction d2 and gradually decrease until the implant angle is zero along the d1 direction and gradually increased until the implant ions are projected along d3 direction. Therefore the implant operation forms a P+ region 5000 at the bottom surface of the open area with a sheet resistance of 120 ohms/sq, and also forming P-type transition regions 50001. The implant angle 1 can be calculated as $1=\arctan(w_1/h_{20})$ where h20 is the vertical depth of the etching process.

The processes continue according to FIG. 35d that shows step S5 wherein the blocking layer 3000 is removed to exposed the N+ diffusion layer 2000 and P+ dopant region 50000 and the P+ transition region 50001 to make a PN structure as that shown in FIG. 35c wherein the N+ diffusion layer 2000 that is not etched off is the N+ dopant region for the PN structure. Other than the processing steps described above, other processes are the same as that applied in the Fifty-sixth Embodiment.

Eighty-First Embodiment

The description of the manufacturing processes of this embodiment is based on FIGS. 30-31, 32b-33d, 35d and 35h.

The functional and structural principles and the manufacturing processes of this embodiment are the same as the Eightieth Embodiment. The differences of this embodiment are the processes carried out after the completion of the PN structure shown in FIG. 35d that includes the N+ diffusion layer 2000 that is not etched off and the P+ dopant region and the P+ transition region 50001 and the steps that follows.

Referring to FIG. 35h, an N+ layer 6000 is formed at the backside of the substrate 1000 by implanting phosphorous ions to form the N+ layer 6000. The processes of this embodiment thus forming a PN structure as that shown in FIG. 35gh Eighty-Second Embodiment The description of the manufacturing processes of this embodiment is based on FIGS. 30-31, 32b-33d, 35d and 35l.

The functional and structural principles and the manufacturing processes of this embodiment are the same as the Eightieth Embodiment. The differences of this embodiment are the processes carried out after the completion of the PN structure shown in FIG. 35*d* that includes the N+ diffusion layer 2000 that is not etched off and the P+ dopant region and the P+ transition region 50001 and the steps that follows.

Referring to FIG. 35*l*, a heat process, is carried out to at a temperature of 900 degrees Celsius for ten minutes to diffuse the N+ diffusion layer 2000 that is not etched off to form the N+ diffusion region 20001. The P+ dopant region 5000 and the N+ diffusion region 20001*ae* separated and the N+ diffusion layer 2000 and the N+ diffusion region 20001 function as N+ region for the PN structure.

Eighty-Third Embodiment

The description of the manufacturing processes of this embodiment is based on FIGS. 30-31, 32*b*-33*d*, 35*d* and 35*p*.

The functional and structural principles and the manufacturing processes of this embodiment are the same as the Eightieth Embodiment. The differences of this embodiment are the processes carried out after the completion of the PN structure shown in FIG. 35*d* that includes the N+ diffusion layer 2000 that is not etched off and the P+ dopant region and the P+ transition region 50001 and the steps that follows.

Referring to FIG. 35*p*, a heat process is carried out to process the N-type substrate shown in FIG. 35*d* to diffuse the N+ diffusion layer 2000 that is not etched off to form the N+ diffusion region 20001. The P+ dopant region 5000 and the N+ diffusion region 20001*ae* separated and the N+ diffusion layer 2000 and the N+ diffusion region 20001 function as N+ region for the PN structure. In the meantime, the N+ diffusion layer 6000 at the backside of the N-type substrate is also diffused to make a PN structure as that show in FIG. 35*p*.

Eighty-Forth Embodiment

The description of the manufacturing processes of this embodiment is based on FIG. 30-31, 32*b*, 33*d*, 35*d*, 35*l* and 35*t*.

After making the PN structure shown in FIG. 35*l* following the processes described in the Eighty-second Embodiment, further processes are carried out according to the FIG. 35*t* wherein the N+ diffusion layer not removed by the etch process is removed and wherein the N+ diffusion region 20001 and the P+ dopant region 5000 are separated. The diffusion region 20001 and the N+ layer 2000 that is not etched off function together as the N-region for the PN structure.

Eighty-Fifth Embodiment

The description of the manufacturing processes of this embodiment is based on FIGS. 30-31, 32*b*, 33*d*, 35*d*, 35*p* and 35*x*.

Figure 35X:
Figure 36A:
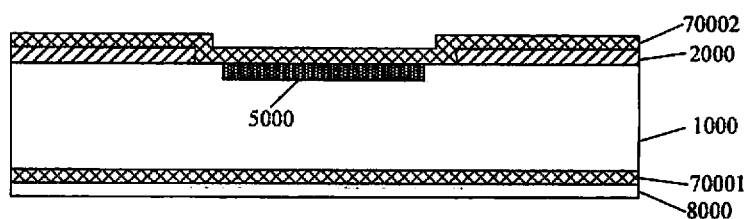
FIGS. 36a to 36x are a set of cross sectional views for showing the processes of forming the passivation layers in the front and back sides of the substrate as the processing steps implemented in different embodiment described below.
Figure 36B:
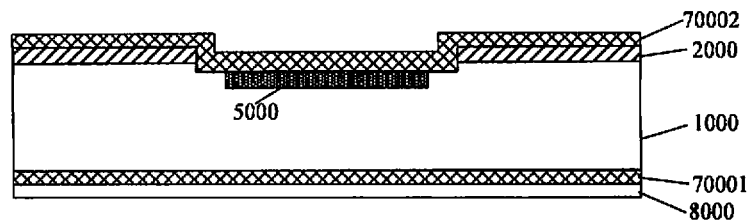
Figure 36C:
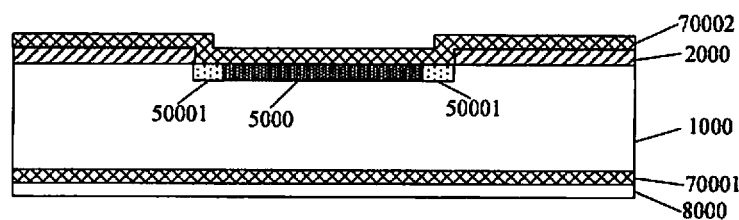
Figure 36D:
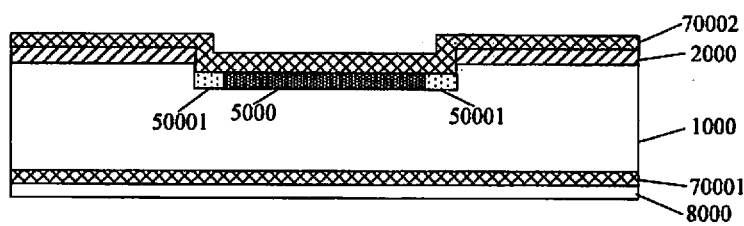
Figure 36E:
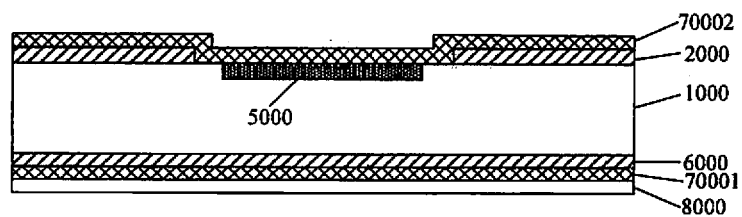
Figure 36F:
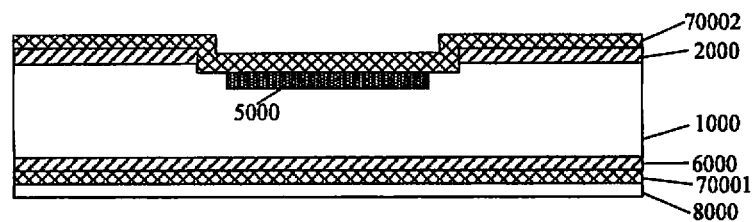
Figure 36G:
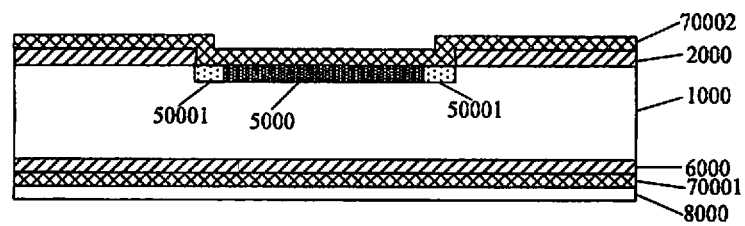
Figure 36H:
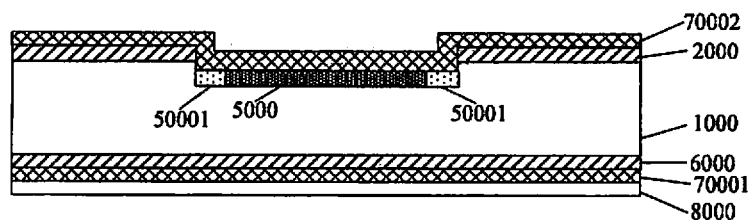
Figure 36I:
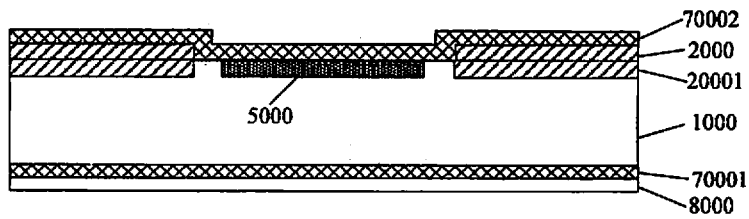
Figure 36J:
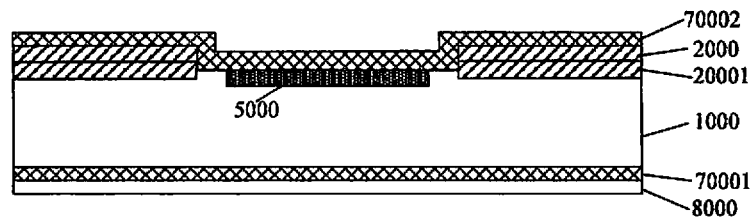
Figure 36K:
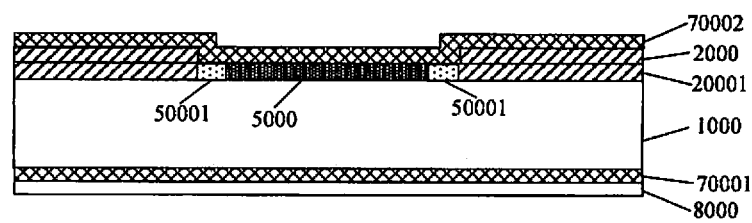
Figure 36L:
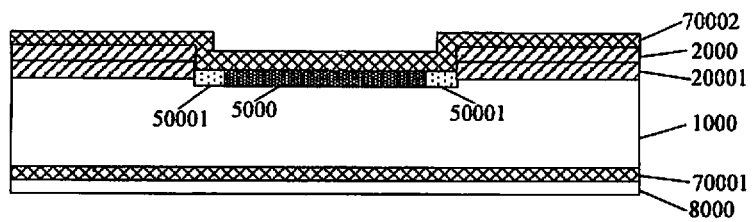
Figure 36M:
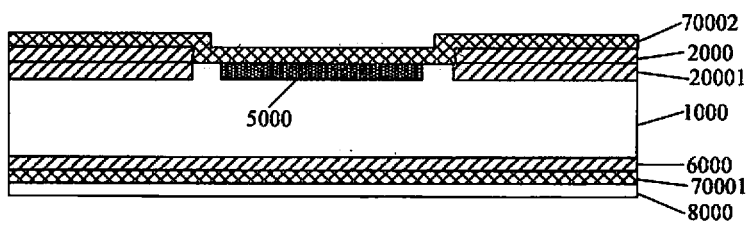
Figure 36N:
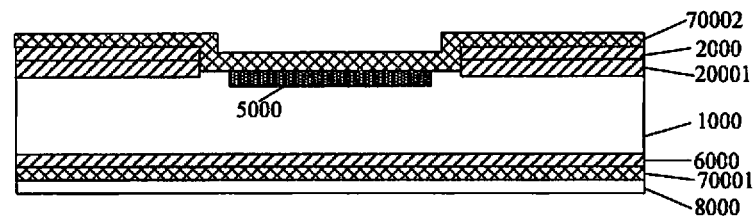
Figure 36O:
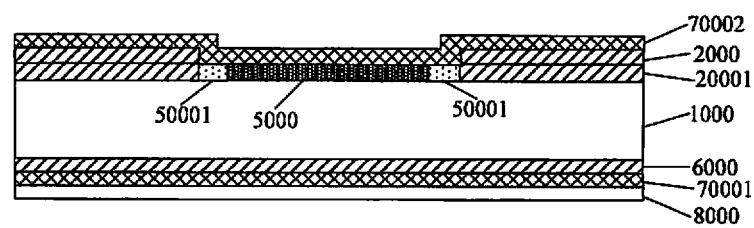
Figure 36P:
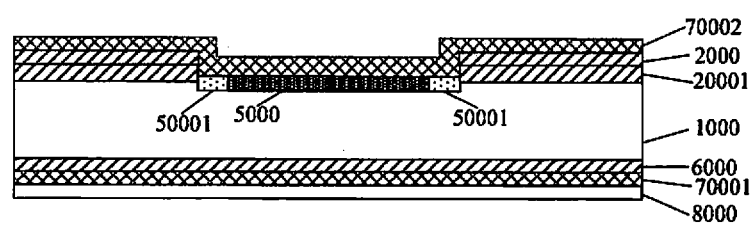
Figure 36Q:
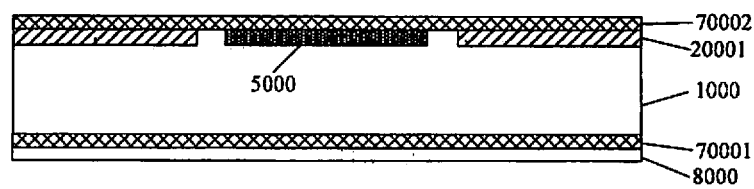
Figure 36R:
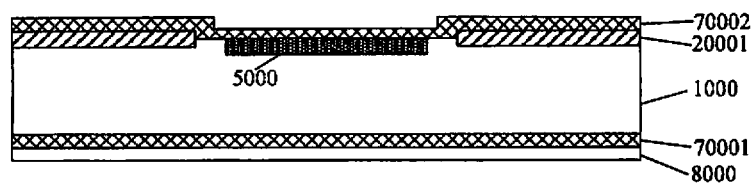
Figure 36S:
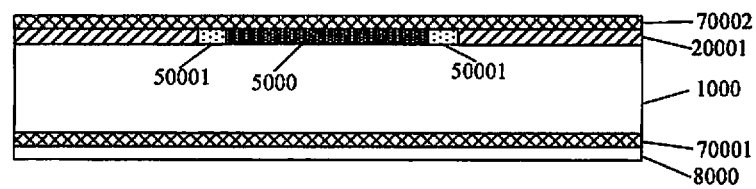
Figure 36T:
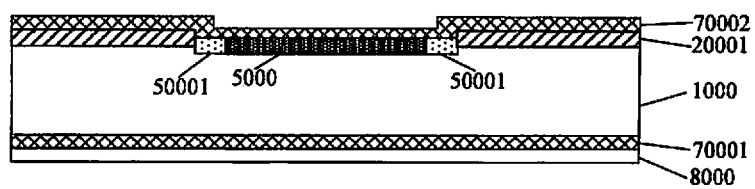
Figure 36U:
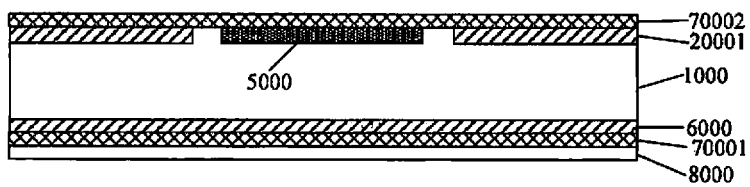
Figure 36V:
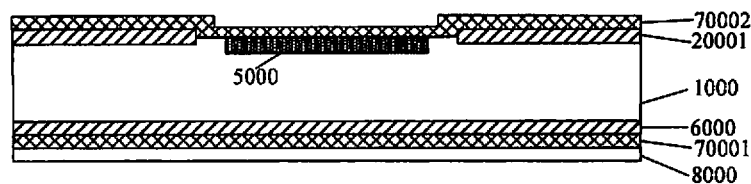
Figure 36W:
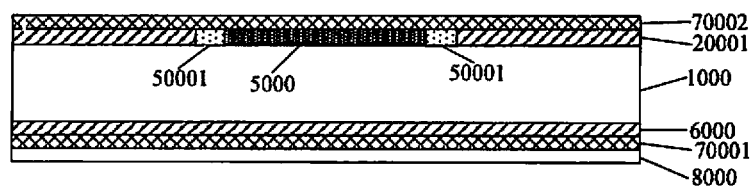
Figure 36X:
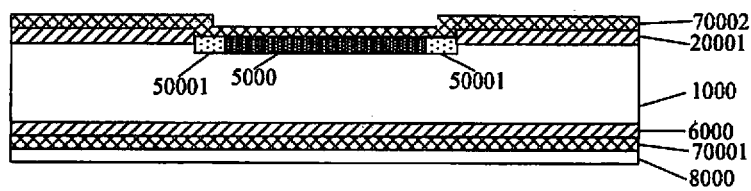

After making the PN structure shown in FIG. 35*p* following the processes described in the Eighty-third Embodiment, further processes are carried out according to the FIG. 35*x* wherein the N+ diffusion layer not removed by the etch process is removed and wherein the N+ diffusion region 20001 and the P+ dopant region 5000 are separated. The diffusion region 20001 and the N+ layer 2000 that is not etched off function together as the N-region for the PN structure shown in FIG. 35*x*.

Eighty-Sixth Embodiment

The description of the manufacturing processes of this embodiment is based on FIG. 30-31, 32*b*, 33*d*, 35*d*, 37*d* and the Eightieth. Embodiment.

After making the PN structure shown in FIG. 35*d* following the processes described in the Eightieth Embodiment, further processes are carried out according to the Seventh Embodiment to form the passivation layer shown in FIG. 37*d* with positive electrode 90001 and negative electrode 90002 contacting the P+ dopant region 5000 and the N+ dopant region 20001 respectively.

Eighty-Seventh Embodiment

The description of the manufacturing processes of this embodiment is based on FIG. 30-31, 32*b*, 33*d*, 35*h*, 37*h* and the Eighty-First Embodiment.

After making the PN structure shown in FIG. 35*h* following the processes described in the Eighty-first Embodiment, further processes are carried out according to the Seventh Embodiment to form the passivation layer shown in FIG. 37*h* with positive electrode 90001 and negative electrode 90002 contacting the P+ dopant region 5000 and the N+ dopant region 20001 respectively.

Eighty-Eight Embodiment

The description of the manufacturing processes of this embodiment is based on FIG. 30-31, 32*b*, 33*d*, 35*l*, 37*l* and the Eighty-second Embodiment.

After making the PN structure shown in FIG. 35*l* following the processes described in the Eighty-second Embodiment, further processes are carried out according to the Seventh Embodiment to form the passivation layer shown in FIG. 37*l* with positive electrode 90001 and negative electrode 90002 contacting the P+ dopant region 5000 and the N+ dopant region 20001 respectively.

Eighty-Ninth Embodiment

The description of the manufacturing processes of this embodiment is based on FIG. 30-31, 32*b*, 33*d*, 35*p*, 37*p* and the Eighty-third Embodiment.

After making the PN structure shown in FIG. 35*p* following the processes described in the Eighty-third Embodiment, further processes are carried out according to the Seventh Embodiment to form the passivation layer shown in FIG. 37*p* with positive electrode 90001 and negative electrode 90002 contacting the P+ dopant region 5000 and the N+ dopant region 20001 respectively.

Ninetieth Embodiment

The description of the manufacturing processes of this embodiment is based on FIG. 30-31, 32*b*, 33*d*, 35*t*, 37*t* and the Eighty-forth Embodiment.

After making the PN structure shown in FIG. 35*t* following the processes described in the Eighty-forth Embodiment, further processes are carried out according to the Seventh Embodiment to form the passivation layer shown in FIG. 37*t* with positive electrode 90001 and negative electrode 90002 contacting the P+ dopant region 5000 and the N+ dopant region 20001 respectively.

Ninety-First Embodiment

The description of the manufacturing processes of this embodiment is based on FIG. 30-31, 32*b*, 33*d*, 35*x*, 37*x* and the Eighty-fifth Embodiment.

Figure 37X:
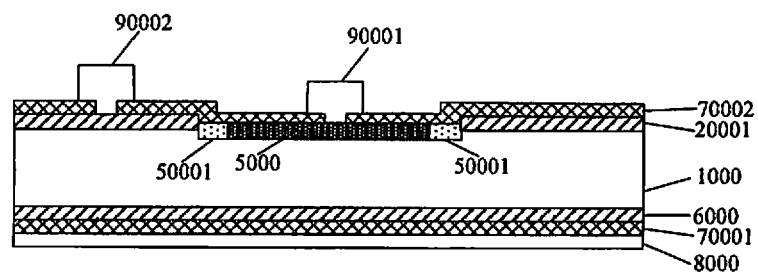

After making the PN structure shown in FIG. 35x following the processes described in the Eighty-forth Embodiment, further processes are carried out according to the Seventh Embodiment to form the passivation layer shown in FIG. 37x with positive electrode 90001 and negative electrode 90002 contacting the P+ dopant region 5000 and the N+ dopant region 200001 respectively.

Although the present invention has been described in terms of the presently preferred embodiment, it is to be understood that such disclosure is not to be interpreted as limiting. Various alterations and modifications will no doubt become apparent to those skilled in the art after reading the above disclosure. Accordingly, it is intended that the appended claims be interpreted as covering all alterations and modifications as fall within the true spirit and scope of the invention.

We claim:

1. A method for manufacturing a PN structure on a semiconductor substrate of a first conductivity type comprising:
    doping a top layer on a first surface of the semiconductor substrate as a first conductivity type layer;
    covering the first conductivity type layer with a blocking layer;
    etching a doping opening through the blocking layer and removing the first conductivity type layer beneath the doping opening to expose a bottom opening area on the first surface of the semiconductor substrate wherein the bottom opening area having a greater area than the doping opening thus leaving an un-etched portion of the first conductivity layer surrounding the bottom opening area; and
    doping a central portion of the bottom opening area vertically aligned with the doping opening on the first surface of the semiconductor substrate with dopant ions of a second conductivity type to form a central second conductivity region disposed at a distance away from the un-etched portion of the first conductivity type layer surrounding the bottom opening area to constitute the PN structure.

2. The method of claim 1 wherein:
    the step of doping the central portion of the bottom opening area on the first surface of the semiconductor substrate comprising a step of introducing dopant ions of the second conductivity type through the doping opening as a vertically-aligned doping process.

3. The method of claim 1 wherein:
    the step of removing the first conductivity type layer beneath the doping opening further comprising a step of applying an anisotropic etch to remove the first conductivity type layer to open the bottom opening area having the greater area than the doping opening.

4. The method of claim 3 wherein:
    the step of doping the central portion of the bottom opening area on the first surface of the semiconductor substrate comprising a step of implanting the dopant ions of the second conductivity type through the doping opening along a perpendicular direction relative to the first surface of the first semiconductor substrate.

5. The method of claim 3 wherein:
    the step of doping the central portion of the bottom opening area on the first surface of the semiconductor substrate comprising a step of implanting the dopant ions of the second conductivity type through the doping opening by changing an ion implanting angle between a minimum and a maximum implanting angles.

6. The method of claim 1 wherein:
    the step of removing the first conductivity type layer beneath the doping opening further comprising a step of applying an etch process to remove only the first conductivity type layer to open the bottom opening area and to expose the first surface of the semiconductor substrate with the bottom opening area having a greater area than the doping opening.

7. The method of claim 1 wherein:
    the step of removing the first conductivity type layer beneath the doping opening further comprising a step of applying an etch process to remove the first conductivity type layer and a top portion of the first surface of the semiconductor substrate thus opening a shallow trench into the semiconductor substrate.

8. The method of claim 1 wherein:
    the semiconductor substrate is a N-type semiconductor substrate and the first conductivity type layer is an N+ layer and the central second conductivity type region is a P+ region.

9. The method of claim 1 wherein:
    the semiconductor substrate is a P-type semiconductor substrate and the first conductivity type layer is an P+ layer and the second conductivity type region is a N+ region.

10. The method of claim 1 further comprising:
    covering the PN structure formed on the first semiconductor surface with a passivation layer and opening contact openings on top of the un-etched portion of the first conductivity type layer; and
    opening contact openings on top of the second conductivity type region and filling metal contact in the contact openings to form a first conductivity type electrode and a second conductivity type electrode respectively.

* * * * *